United States Patent
Hattori et al.

(10) Patent No.: US 7,196,999 B2
(45) Date of Patent: *Mar. 27, 2007

(54) METHOD AND APPARATUS FOR REPRODUCING DATA AND METHOD AND APPARATUS FOR RECORDING AND/OR REPRODUCING DATA

(75) Inventors: Masayuki Hattori, Kanagawa (JP); Jun Murayama, Tokyo (JP); Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 846 days.

This patent is subject to a terminal disclaimer.

(21) Appl. No.: 09/814,379

(22) Filed: Mar. 21, 2001

(65) Prior Publication Data

US 2002/0057640 A1 May 16, 2002

(30) Foreign Application Priority Data

Mar. 23, 2000 (JP) ............................. 2000-087127

(51) Int. Cl.
*G11B 5/09* (2006.01)

(52) U.S. Cl. ............................. 369/59.22; 369/124.04; 714/746

(58) Field of Classification Search ............. 369/47.18, 369/47.19, 47.21, 47.22, 59.22, 59.23, 59.24, 369/59.25, 59.27, 124.04, 124.06, 124.09, 369/124.07; 360/40, 45, 53; 714/792, 794, 714/795, 769, 755; 375/755, 254, 265, 285

See application file for complete search history.

(56) References Cited

U.S. PATENT DOCUMENTS

| | | | | |
|---|---|---|---|---|
| 5,060,221 A | * | 10/1991 | Sako et al. ............... | 369/59.25 |
| 5,241,563 A | * | 8/1993 | Paik et al. ................. | 375/262 |
| 5,263,051 A | * | 11/1993 | Eyuboglu ................ | 714/792 |
| 5,392,299 A | * | 2/1995 | Rhines et al. ............ | 714/756 |
| 5,400,347 A | * | 3/1995 | Lee ........................... | 714/756 |

(Continued)

FOREIGN PATENT DOCUMENTS

EP 0 802 634 10/1997

OTHER PUBLICATIONS

Oberg M et al: "Parity check codes for partial response channels" Global Telecommunications Conference, Globecom '99, vol. 1B, Dec. 5, 1999, pp. 717-722, XP010373642.

(Continued)

*Primary Examiner*—Thang V. Tran
(74) *Attorney, Agent, or Firm*—Finnegan, Henderson, Farabow, Garrett & Dunner, L.L.P.

(57) ABSTRACT

A method and apparatus for recording or reproducing data in which high performance encoding and a high efficiency decoding are realized to lower the decoding error rate. A magnetic recording and/or reproducing apparatus 50 includes, in a recording system, a modulation encoder 52 for modulation encoding input data in a predetermined fashion and an interleaver 53 for interleaving data supplied from the modulation encoder 52 to re-array the data sequence. The magnetic recording and/or reproducing apparatus 50 also includes, in a reproducing system, a first deinterleaver for interleaving the input data for re-arraying the data sequence so that the bit sequence of data re-arrayed by the interleaver 53 will be restored to its original bit sequence, a modulation SISO decoder for modulation decoding data supplied from the first deinterleaver and a second deinterleaver for interleaving data corresponding to a difference value between data output by the modulation SISO decoder and data output by the first deinterleaver to re-array the data sequence of the difference data.

56 Claims, 11 Drawing Sheets

U.S. PATENT DOCUMENTS

| | | | | |
|---|---|---|---|---|
| 5,635,933 A | * | 6/1997 | Fitzpatrick et al. | 360/40 |
| 5,732,088 A | * | 3/1998 | Sako | 369/275.3 |
| 6,405,342 B1 | * | 6/2002 | Lee | 714/792 |
| 6,546,518 B1 | * | 4/2003 | Leung et al. | 360/53 |
| 6,662,337 B1 | * | 12/2003 | Brink | 714/792 |
| 6,694,477 B1 | * | 2/2004 | Lee | 714/795 |
| 6,826,722 B2 | * | 11/2004 | Miyauchi et al. | 714/752 |

OTHER PUBLICATIONS

Benedetto S et al: "Serial Concatenation of Interleaved Codes: Performance Analysis, Design, and Iterative Decoding" TDA Progress Report, 42-126, 'Online! Aug. 15, 1996, XP002163216, Retrieved from the Internet: URL:http://tmo.jpl.nasa.gov/tmo/progress_report/42-46/title.htm> 'retrieved on Mar. 19, 2001!.

Souvignier T et al: "Turbo Decoding for PR4: Parallel Versus Serial Concatenation" ICC '99. 1999 IEEE International Conference on Communications. Conference Record. Vancouver, CA, Jun. 6-10, 1999, IEEE International Conference on Communications, New York, NY : IEEE, US, vol. vol. 3, Jun. 6, 1999, pp. 1638-1642, XP002170541 ISBN: 0-7803-5285-8.

Fan J L et al: "Constrained Coding Techniques for Soft Iterative Decoders" 1999 IEEE Global Telecommunications Conference. Globecom'99. Seamless Interconnection for Universal Services. Rio de Janeiro, Brazil, Dec. 5-9, 1999, IEEE Global Telecommunications Conference, New York, NY : IEEE, US, vol. vol. 1B, Dec. 5, 1999, pp. 723-727, XP002170347 ISBN: 0-7803-5797-3.

Petersen J et al: Informationstechnische Gesellschaft Im VDE (ITG): "Implementierungsaspekte Zur Symbol-By-Symbol Map-Decodierung Von Faltungscodes" Codierung Fur Quelle, Kanal Und Ubertragung. Vortrage Der Itg-Fachtagung, Munchen, Oct. 26-28, 1994, ItG Fachberichte, Berlin, VDE Verlag, DE, vol. NR. 130, 1994, pp. 41-48, XP000503776 ISBN: 3-8007-2036-1.

Lynch R T: "Channels and Codes for Magnetooptical Recording" IEEE Journal on Selected Areas in Communications, IEEE Inc. New York, US, vol. 10, No. 1, 1992, pp. 57-72, XP000462065 ISSN: 0733-8716.

Battail G: "Polynomial Description of Linear Block Codes and its Applications to Soft-Input, Soft-Output Decoding" Annales Des Telecommunications—Annals of Telecommunications, Presses Polytechniques et Iniversitaires Romandes, Lausanne, Ch, vol. 54, No. ¾, Mar. 1999, pp. 148-165, XP000834637 ISSN: 0003-4347.

Cideciyan R D et al: "A PRML System for Digital Magnetic Recording" IEEE Journal on Selected Areas in Communications, IEEE Inc. New York, US, vol. 10, No. 1, 1992, pp. 38-56, XP00457625 ISSN: 0733-8716.

Benedetto S et al: Institute of Electrical & Electronics Engineers: "Soft-Output Decoding Algorithms for Continuous Decoding of Parallel Concatenated Convolutional Codes" 1996 IEEE International Conference on Communications (ICC). Converging Technologies for Tommorow's Applications. Dallas, Jun. 23-27, 1996, IEEE International Conference on Communications (ICC), New York, IEEE, US, vol. vol. 1, Jun. 23, 1996, pp. 112-117, XP000625652 ISBN: 0-7803-3251-2.

Benedetto S et al: "Soft-Input Soft-Output Modules for the Construction and Distributed Iterative Decoding of Code Networks" European Transactions on Telecommunications, Eurel Publication, Milano, IT, vol. 9, No. 2, Mar. 1, 1998, pp. 155-172, XP000751912 ISSN: 1124-318X.

Offer E Ed—Informationstechnische Gesellschaft Im VDE (ITG): "Soft-In/Soft-Out Decoders for Linear Block Codes" Codierung Fur Quelle, Kanal Und Ubertragung. Vortrage Der ITG-Fachtagung, Munchen, Oct. 26-28, 1994, ITG Fachberichte, Berlin, VDE Verlag, DE, vol. NR. 130, 1994, pp. 31-40, XP000503775 ISBN: 3-8007-2036-1.

Siegel P H et al: "Modulation and Coding for Information Storage" IEEE Communications Magazine, IEEE Service Center, Piscataway, N.J, US, vol. 29, No. 12, Dec. 1, 1991, pp. 68-86, XP000287983 ISSN: 0163-6804.

* cited by examiner

METHOD AND APPARATUS FOR REPRODUCING DATA AND METHOD AND APPARATUS FOR RECORDING AND/OR REPRODUCING DATA

BACKGROUND OF THE INVENTION

1. Field of the Invention

This invention relates to a method and apparatus for recording data on a recording medium, a method and apparatus for reproducing data recorded on a recording medium and a method and apparatus for recording and/or reproducing data for a recording medium.

2. Description of Related Art

As a recording medium for recording digital data, there are known a wide variety of recording mediums of the magnetic, optical or photomagnetic system, such as a hard disc, a so-called DVCR (digital video cassette recorder) or a so-called CD (Compact Disc), DVD (digital versatile disc) and a so-called MO (magneto-optical disc).

For recording signals on these recording mediums, physical processing needs to be performed on the recording mediums, such as by controlling the direction of magnetization by a write head for a recording medium of the magnetic recording system, or by forming pits of lengths corresponding to signals by a stamper for a recording medium of the optical recording system. In this case, in order to permit amplitude control of readout signals or clock reproduction on the reproducing side reading out the signals recorded on the recording medium to operate as normally, the signal recording side for recording signals on a recording medium routinely uses a system of modulation encoding the signal in a pre-set manner to record the resulting modulation-coded signal.

A modulation-coder, performing this modulation coding, routinely is fed with binary signals exempt from various limitations, and outputs binary signals free of various limitations. These limitations on the signals include DC free limitations which state that the numbers of "0"s and "1"s be equalized over a sufficient long length of the concatenations of "0"s and "1"s, and the (d, k) limitations which state that the minimum and maximum numbers of consecutive "0"s and "1"s in a code be d and k, respectively. FIG. 1 shows an input/output example in a modulation coder outputting a code satisfying the (d, k)=(2, 7) limitations. Specifically, a modulation coder 150, outputting a code satisfying the (d, k)=(2, 7) limitation, is shown in FIG. 1, by way of concrete explanation of the concept of the (d, k) limitations. That is, if an input signal, free of the limitation, is input to the modulation coder 150, outputting a code satisfying the (d, k)=(2, 7) limitation, modulation-encodes the input signal to generate and output an output signal in which the minimum and maximum numbers of consecutive "0"s are 2 and 7, respectively.

The above example indicates that, in converting a bit string free of a limitation is converted into another bit string subjected to a limitation, the total number of the output bits is larger than that of the input bits. If the total number of input bits is K and the total number of output bits is N, the ratio K/N is represented as a code rate R. This code rate R serves as an index indicating the efficiency of the modulation coding. If two or more modulation coders, generating output signals satisfying the same limitations, are compared to one another, a modulation coder having the high code rate R is able to encode more input bits for a given number of output bits than one having the low code rate R. Stated differently, a modulation coder having a high code rate R is able to record more information on a pre-set recording medium than one having a low code rate R.

The modulation coding may be classified into a block coding system in which input bits are divided into plural blocks of pre-set lengths and output bits generated are divided into plural blocks of pre-set lengths corresponding to the blocks of the input bits, and a variable length coding system, in which encoding units of input bits and output bits associated with the input bits are varied. For example, the so-called 8/9 code or the 16/17 code, routinely used for modulation coding, belong to the block coding system, whilst the so-called (1, 7) RLL code or the (2, 7) RLL code belong to the variable length encoding system.

For example, in a block modulation encoding system, fed with two bits as input bits, and generating three output bits satisfying the (d, k)=(0, 2) limitations, a modulation coder has a conversion table as Table 1:

TABLE 1

Example of Conversion Table

| input bits | output bits |
|---|---|
| 00 | 011 |
| 01 | 101 |
| 10 | 111 |
| 11 | 110 | stored in e.g., a memory, not shown. The modulation coder references this conversion table and finds, for each 2-bit input bits, an associated 3-bit output bits, with the output bits being issued as output sequentially.

On the other hand, a modulation decoder for modulating-decoding the modulation-coded signals has a back-conversion table, as Table 2:

TABLE 2

Example of Back-Conversion Table

| input bit | decoded bits |
|---|---|
| 000 | 01 |
| 001 | 00 |
| 010 | 10 |
| 011 | 00 |
| 100 | 11 |
| 101 | 01 |
| 110 | 11 |
| 111 | 10 | corresponding to the conversion table of Table 1, stored in e.g., a memory, not shown. The modulation decoder references this back-conversion table to find and sequentially output 2-bit decoded bits, associated with the 3-bit input bits.

FIG. 2 shows a typical modulation decoder 160 having at least a ROM (read-only memory) 161. The modulation decoder 160 is fed with an input address signal D161 to output the contents stored in an address of the ROM 161 corresponding to this input address signal D161 as a demodulated decoded signal D162. In actuality, if the input bits are back-converted into decoded bits in accordance with the back-conversion table shown in Table 2, the contents of the decoded bits are stored in addresses of a ROM 161 of the modulation decoder 160, corresponding to the input bits in Table 2. The decoded bits, stored in these addresses, are read out by way of performing the back-conversion.

FIG. 3 shows a typical modulation decoder 170 at least having a combination circuit 171. The modulation decoder 170 is fed with an input signal D171 and executes logical operations on the input signal D171 by the combination circuit 171 to generate a modulated decoded signal D172. In actuality, if, in performing back conversion from the input bits to the decoded bits in accordance with the back-conversion table of Table 2, the three-bit input signal D171 is represented as $(a_0, a_1, a_2)$ and a two-bit modulated decoded signal D172 is represented as $(b_0, b_1)$, the modulation decoder 170 generates the output bits $(b_0, b_1)$ by the combination circuit 171 corresponding to the following logical equations (1):

$$b_0 = (a_1 \& a_2) | (a_0 \& !a_1 \& !a_2) | (!a_0 \& a_1 \& !a_2)$$

$$b_1 = (a_0 \& !a_1) | (!a_0 \& !a_1 \& !a_2) | (a_0 \& a_1 \& !a_2) \quad (1)$$

where |, & and ! indicate the logical sum, logical product and logical negation, respectively.

If the modulation coder and the modulation decoder are applied to a magnetic recording and/or reproducing apparatus for recording and/or reproducing data on or from a recording medium in accordance with the magnetic recording system, the recording and/or reproducing apparatus is configured as shown in FIG. 4.

That is, the magnetic recording and/or reproducing apparatus 200, shown in FIG. 4, includes, as a recording system for recording data on a recording medium 250, an error correction encoder 201 for error correction encoding input data, a modulation encoder 201, a modulation encoder 202 for modulation encoding the input data, a precoder 203 for filtering input data for compensating its channel characteristics, a write current driver 204 for converting respective bits of the input data into write current values, and a write head 205 for recording data on the recording medium 250. The magnetic recording and/or reproducing apparatus 200 also includes, as a playback system for reproducing data recorded on the recording medium 250, a readout head 206 for reading out data recording on the recording medium 250, an equalizer 207 for equalizing the input data, a gain adjustment circuit 208 for adjusting the gain of the input data, an analog/digital converter (A/D converter) 209 for converting analog data into digital data, a timing generating circuit 210 for generating clocks, a gain adjustment control circuit 211 for controlling the gain adjustment circuit 208, a viterbi decoder 212 for viterbi-decoding the input bits, a modulation decoder 213 for modulation decoding the input data and an error correction decoder 214 for error correction decoding the input data.

In recording data on the recording medium 250, the magnetic recording and/or reproducing apparatus 200 performs the following operations:

When fed with the input data D201 the magnetic recording and/or reproducing apparatus 200 applies error correction coding to the input data D201, by the error correction encoder 201, to generate error correction encoded data D202.

The magnetic recording and/or reproducing apparatus 200 modulation encodes the error correction encoded data D202 from the error correction encoder 201, by the modulation encoder 202, to generate modulation-encoded data D203, which is a string of bits subjected to limitations.

The magnetic recording and/or reproducing apparatus 200 performs filtering on the modulation-encoded data D203, supplied from the modulation encoder 202, by the precoder 203, in such a manner as to compensate for the channel characteristics as from the writing of data on the recording medium 250 up to outputting thereof at an equalizer 207 in the reproducing system, to generate a precode signal D204. For example, if the channel has 1−D characteristics, the precoder 203 performs the filtering F indicated by the following equation (2):

$$F = 1/(1 \oplus D) \quad (2)$$

where $\oplus$ denotes exclusive-OR.

The magnetic recording and/or reproducing apparatus 200 then converts respective bits of the precode signal D204, as binary signal supplied from the precoder 203, by a write current driver 204, into write current values Is, such as by $0 \rightarrow -I_S$, $1 \rightarrow +I_S$, to generate a write current signal D205.

By the write head 205, the magnetic recording and/or reproducing apparatus 200 applies a magnetic write signal D206, corresponding to the write current signal D205 supplied from the write current driver 204, to the recording medium 250.

By the above processing, the magnetic recording and/or reproducing apparatus 200 is able to record data on the recording medium 250.

In reproducing the data recorded on the recording medium 250, the magnetic recording and/or reproducing apparatus 200 performs the following processing:

First, the magnetic recording and/or reproducing apparatus 200 reads out the. readout magnetization signal D207 from the recording medium 250 by the readout head 206 to generate a readout current signal D208 conforming to this readout magnetization signal D207.

The magnetic recording and/or reproducing apparatus 200 then equalizes the readout current signal D208, supplied from the readout head 206, by the equalizer 207, so that the channel response since data writing on the recording medium 250 in the recording system until outputting thereof at the equalizer 207 will be of pre-set characteristics, such as 1−D, to generate an equalized signal D209.

The magnetic recording and/or reproducing apparatus 200 then adjusts the gain of the equalized signal D209, supplied from the equalizer 207, by the gain adjustment circuit 208, based on a gain adjustment control signal D213 from the gain adjustment control circuit 211, to generate a gain adjustment signal D210. Meanwhile, the gain adjustment control signal D213 is generated by the gain adjustment control circuit 211, based on the digital channel signal D211, as later explained. Specifically, the gain adjustment control signal D213 is a control signal for maintaining the amplitude of the equalization signal D209 at an expected value.

By the A/D converter 209, the magnetic recording and/or reproducing apparatus 200 digitizes the gain adjustment signal D210, supplied from the gain adjustment circuit 208, to generate the digital channel signal D211. Meanwhile, the A/D converter 209 performs sampling based on the clock signal D212 generated and supplied by the timing generating circuit 210. The timing generating circuit 210, fed with the digital channel signal D211, generates clocks to produce clock signals D212 which are output to the A/D converter 209.

The magnetic recording and/or reproducing apparatus 200 feeds the digital channel signal D211, supplied from the A/D converter 209, to the viterbi decoder 212, which then performs viterbi decoding on the channel response from the upstream side of the precoder 203 in the recording system up to the outputting at the equalizer 207 in the reproducing system, for example, the channel response $R_{ch}$ represented by the following equation (3):

$$R_{ch}=(1-D)/(1 \oplus D) \quad (3)$$

where $\oplus$ denotes Exclusive-OR.

The magnetic recording and/or reproducing apparatus 200 then applies modulation decoding on the viterbi decoded signal D214, supplied from the modulation decoder 213, to realize data correspondence reversed from that in the modulation encoder 202 in the recording system to generate a modulated decoded signal D215 which is an original input data string not subjected to limitations.

The magnetic recording and/or reproducing apparatus 200 decodes the error correction codes of the modulated decoded signal D215, supplied from the modulation decoder 213, by the error correction decoder 214, to generate output data D216.

By the above processing, the magnetic recording and/or reproducing apparatus 200 is able to reproduce the data recorded on the recording medium 250.

Meanwhile, in the above-described conventional magnetic recording and/or reproducing apparatus 200, the modulation decoder 213 has no more than the function of realizing the correspondence between binary signals reversed from that obtained on modulation encoding by the modulation encoder 202, while the signals in both the input and the output of the modulation decoder 213 needs to be binary signals, with the result that the signals on the downstream side of the viterbi decoder 212 are all binary signals.

In other words, it is necessary in the magnetic recording and/or reproducing apparatus 200 to generate binary signals on the upstream side of the modulation decoder 213 and to process the binary signals even on the downstream side of the modulation decoder 213.

Thus, in the magnetic recording and/or reproducing apparatus 200, in which bi-level binary signals need to be used, the information volume in the signal is diminished intentionally with the result that efficient decoding cannot be realized to deteriorate the decoding error rate.

SUMMARY OF THE INVENTION

It is therefore an object of the present invention to provide a method and apparatus for recording data in which high performance encoding may be carried out to cause the reproducing system to perform highly efficient decoding operation to lower the decoding error rate significantly.

It is another object of the present invention to provide a data reproducing method and apparatus for performing efficient decoding to lower the decoding error rate.

It is yet another object of the present invention to provide a data recording and reproducing method and apparatus for realizing high performance encoding and high efficiency decoding to lower the decoding error rate.

In one aspect, the present invention provides a data recording apparatus for recording data on a recording medium, including modulation encoding means for applying predetermined modulation encoding to input data, and interleaving means for interleaving data supplied from the modulation encoding means for re-arraying the data sequence.

In the data recording apparatus, according to the present invention, data supplied from the modulation encoding means is interleaved by the interleaving means for re-arraying the data sequence, thereby realizing high performance encoding.

In another aspect, the present invention provides a data recording method for recording data on a recording medium, including a modulation encoding step of applying predetermined modulation encoding to input data, and a interleaving step of interleaving data supplied from the modulation encoding step for re-arraying the data sequence.

In the data recording method, according to the present invention, data supplied from the modulation encoding step is interleaved in the interleaving step for re-arraying the data sequence for realizing high performance encoding.

In another aspect, the present invention provides a data reproducing apparatus for reproducing data recorded by a recording equipment for recording data on a recording medium, including modulation encoding means for applying predetermined modulation encoding to input data and first interleaving means for interleaving data supplied from the modulation encoding means for re-arraying the data sequence, in which the data reproduction apparatus includes deinterleaving means for interleaving the input data in its sequence such as to restore the sequence of data bits re-arrayed by the first interleaving means to the bit sequence of the data as encoded by the modulation encoding means, modulation decoding means for modulation decoding the data supplied from the deinterleaving means, and second interleaving means for interleaving data corresponding to a difference between data output by the modulation decoding means and data output by the deinterleaving means based on the same interleaving position information as that of the first interleaving means for re-arraying the sequence of the difference data.

In such data reproducing apparatus, according to the present invention, the data re-arrayed in its sequence interleaved by the deinterleaving means is modulation decoded by the modulation decoding means, whilst data corresponding to the difference between data output by the modulation decoding means and data output by the deinterleaving means is interleaved by the second interleaving means for re-arraying the sequence of the different data, whereby efficient decoding can be realized by exploiting the soft information for the entire decoding processing to lower the decoding error rate appreciably.

In still another aspect, the present invention provides a data reproducing method for reproducing data recorded by a recording method for recording data on a recording medium, including a modulation encoding step for applying predetermined modulation encoding to input data and a first interleaving step of interleaving data encoded in the modulation encoding step for re-arraying the data sequence, in which the data reproduction method includes a deinterleaving step of interleaving the input data in its sequence such as to restore the sequence of data bits re-arrayed by the first interleaving step to the bit sequence of the data as encoded by the modulation encoding step, a modulation decoding step of modulation decoding the data supplied from the deinterleaving step and a second interleaving step of interleaving data corresponding to a difference between data decoded in the modulation decoding step and data re-arrayed in the deinterleaving step based on the same interleaving position information as that of the first interleaving step for re-arraying the sequence of the difference data.

In such data reproducing method, according to the present invention, the data re-arrayed in its sequence interleaved by the deinterleaving means is modulation decoded in the modulation decoding step, whilst data corresponding to the difference between data output by the modulation decoding step and data output by the deinterleaving step is interleaved by the second interleaving step for re-arraying the sequence of the different data, whereby efficient decoding can be realized by exploiting the soft information for the entire decoding processing to lower the decoding error rate appreciably.

In still another aspect, the present invention provides a data recording and reproducing apparatus for recording and reproducing data for a recording medium, in which the apparatus includes, as a recording system for recording data on the recording medium, modulation encoding means for applying predetermined modulation encoding to input data, and first interleaving means for interleaving data supplied from the modulation encoding means for re-arraying the data sequence, and in which the apparatus also includes, as a reproducing system for reproducing data recorded on the recording medium, deinterleaving means for interleaving the input data in its sequence such as to restore the sequence of data bits re-arrayed by the first interleaving means to the bit sequence of the data as encoded by the modulation encoding means, modulation decoding means for modulation decoding the data supplied from the deinterleaving means, and second interleaving means for interleaving data corresponding to a difference between data output by the modulation decoding means and data output by the deinterleaving means based on the same interleaving position information as that of the first interleaving means for re-arraying the sequence of the difference data.

In the data recording and reproducing apparatus, according to the present invention, if data is to be recorded on a recording medium, the data supplied from the modulation encoding means is interleaved by first interleaving means to re-array the data sequence, whereas, if data recorded on the recording medium is to be reproduced, data given as a difference between second interleaving means for interleaving data corresponding to a difference between data output by the modulation decoding means and data output by the deinterleaving means based on the same interleaving position information as that of said first interleaving means is interleaved and re-arrayed, so that high performance encoding may be achieved, at the same time as efficient decoding may be achieved by exploiting the soft information for the entire decoding for the code, thus significantly lowering the decoding error rate.

In yet another aspect, the present invention provides a data recording and reproducing method for recording and reproducing data for a recording medium, in which the method includes, as a recording system for recording data on the recording medium, a modulation encoding step for applying predetermined modulation encoding to input data, and a first interleaving step for interleaving data supplied from the modulation encoding step for re-arraying the data sequence, and in which the method also includes, as a reproducing system for reproducing data recorded on the recording medium, a deinterleaving step for interleaving the input data in its sequence such as to restore the sequence of data bits re-arrayed by the first interleaving step to the bit sequence of the data as encoded by the modulation encoding step, a modulation decoding step for modulation decoding the data supplied from the deinterleaving step, and a second interleaving step for interleaving data corresponding to a difference between data decoded in the modulation decoding step and data re-arrayed in the deinterleaving step based on the same interleaving position information as that of the first interleaving step for re-arraying the sequence of the difference data.

In the data recording and reproducing method, according to the present invention, if data is to be recorded on a recording medium, the data supplied from the modulation encoding step is interleaved by the first interleaving step to re-array the data sequence, whereas, if data recorded on the recording medium is to be reproduced, data given as a difference between second interleaving means for interleaving data corresponding to a difference between data output by the modulation decoding means and data output by the deinterleaving means based on the same interleaving position information as that of said first interleaving means is interleaved and re-arrayed, so that high performance encoding may be achieved, at the same time as efficient decoding may be achieved by exploiting the soft information for the entire decoding for the code, thus significantly lowering the decoding error rate.

DESCRIPTION OF THE PREFERRED EMBODIMENTS

Figure 1:
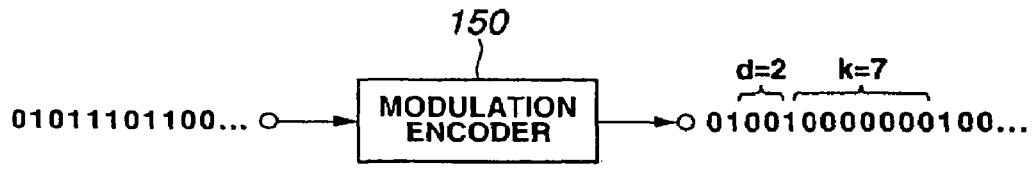
FIG. 1 illustrates an input/output example of a conventional modulation encoder.
Figure 2:
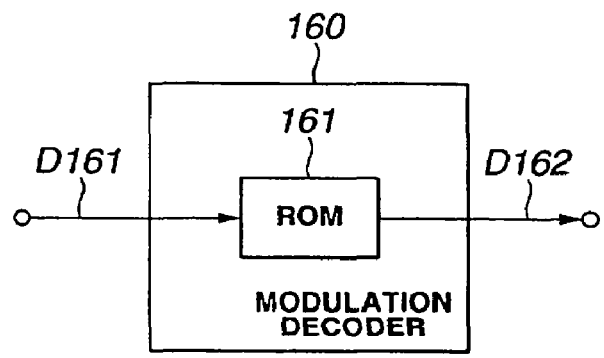
FIG. 2 is a block diagram showing the structure of a conventional modulation decoder.
Figure 3:
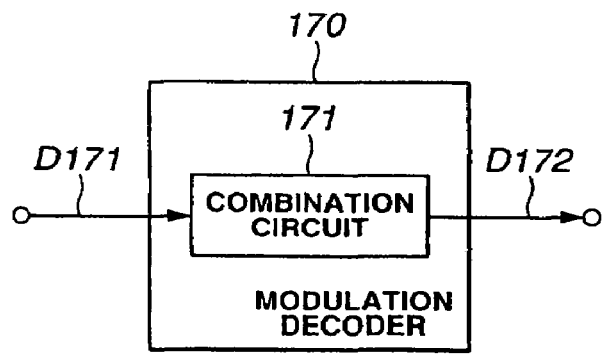
FIG. 3 is a block diagram showing the structure of another conventional modulation decoder.
Figure 4:
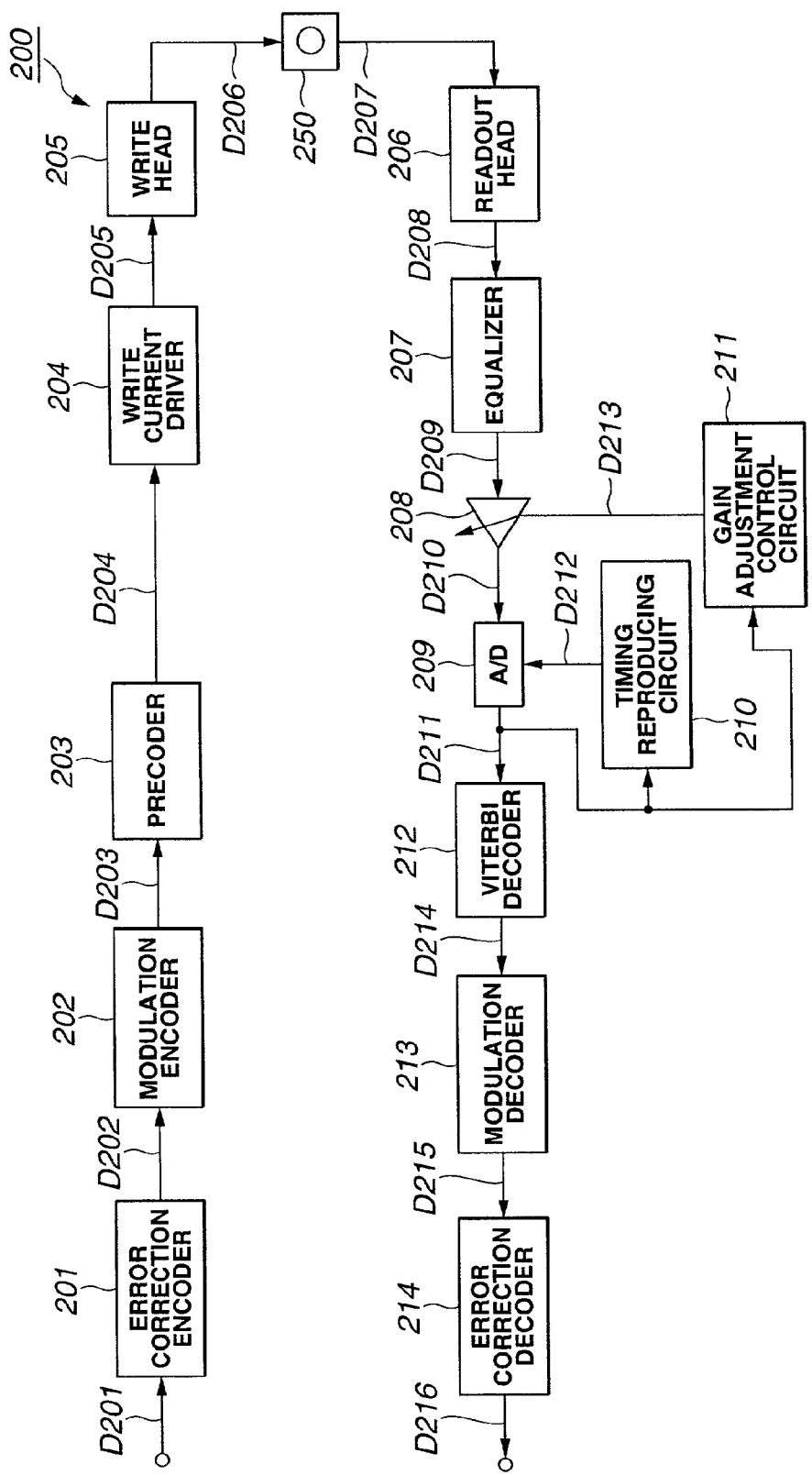
FIG. 4 is a block diagram showing the structure of a conventional magnetic recording and/or reproducing apparatus.

Referring to the drawings, preferred embodiments of the present invention will be explained in detail.

The present embodiment is directed to a magnetic recording and/or reproducing apparatus made up of a recording system for recording data on a recording medium of the magnetic recording system, such as a hard disc or a so-called DVCR (digital video cassette recorder), and a reproducing system for reproducing data recorded on these recording mediums.

This magnetic recording and/or reproducing apparatus includes, in its recording system, an interleaver downstream of a modulation encoder, adapted for modulating signals, and executes encoding by so-called serial concatenated coding between a modulation encoder and a precoder, adapted for performing filtering on signals, in such a manner as to compensate for channel characteristics. Moreover, the magnetic recording and/or reproducing apparatus uses, on the reproducing side, a decoder for the channel and a decoder for modulation decoding the modulation encoded signals, that is an SISO (soft input soft output) type decoder, fed with soft input data to output soft output data, and iteratively executes decoding between these two decoders. This decoding is termed turbo decoding. That is, the magnetic recording and/or reproducing apparatus applies the encoding by the serial concatenated code and turbo decoding, known as the encoding method and decoding method giving the performance close to the Shannon limit as set by what is called the Shannon's theorem on the channel coding, to a recording and/or reproducing system performing data recording and/or reproduction for a recording medium.

First, the magnetic recording and/or reproducing apparatus as a first embodiment is explained. Here, the interleaver, applied to the recording system of this magnetic recording and/or reproducing apparatus, is explained by referring to FIGS. 5 and 6.

Figure 5:
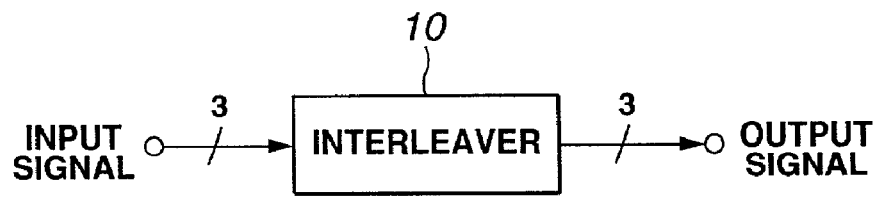
FIG. 5 illustrates an input/output example in an interleaver applied to a recording system of a magnetic recording and/or reproducing apparatus shown as a first embodiment of the present invention.
Figure 6:
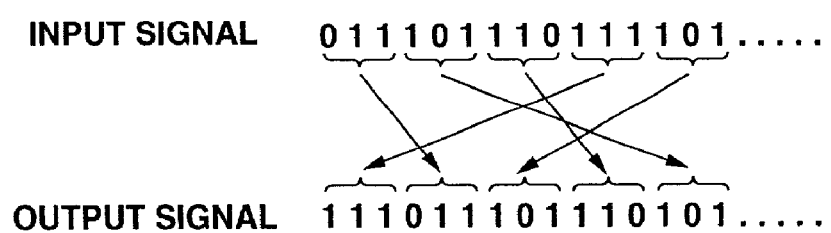
FIG. 6 illustrates the operation of an interleaver used in a recording system of the magnetic recording and/or reproducing apparatus shown in FIG. 5.

An interleaver 10, shown in FIG. 5, interleaves data, encoded by block modulation by a modulation encoder provided on a pre-stage of the interleaver 10, on the modulation code block basis, that is on the symbol basis, to re-array the bits making up the data. For example, if the interleaver 10 re-arrays respective bits of data modulation-encoded to generate 3 output bits for 2 input bits in accordance with a conversion table shown in the following Table 3, the interleaver 10 re-arrays an input signal, fed in a unit of three bits, as a modulation encoder block unit, in a unit of three bits, as shown in FIG. 6, to generate an output signal:

TABLE 3

Example of Conversion Table

| input bits | output bits |
|---|---|
| 00 | 011 |
| 01 | 101 |
| 10 | 111 |
| 11 | 110 |

More specifically, the interleaver 10 holds the interleaving position information of data determined on the basis of generated random numbers in e.g., a ROM (read-only memory), and re-arrays the input signal on the modulation code block basis, based on the interleaving position information. For example, the interleaver 10 holds the interleaving position information of data making up an input signal, and re-arrays the bits on the modulation encoding block basis, in accordance with the interleaving position information, at a timing of generation of the bit string made up of N bits, where N is an optional natural number, to output the re-arrayed bits as an output signal at a preset timing.

The decoder for modulation-decoding the modulation encoded signals, as a SISO type decoder applied to the reproducing system of the magnetic recording and/or reproducing apparatus, is explained with reference to FIGS. 7 and 8. It should be noted that, although the decoders 20, 30, shown in FIGS. 7 and 8, are shown as being the decoders for modulation-decoding the modulation-encoded signals, the decoder for the channel is to be realized in a similar manner.

Figure 7:
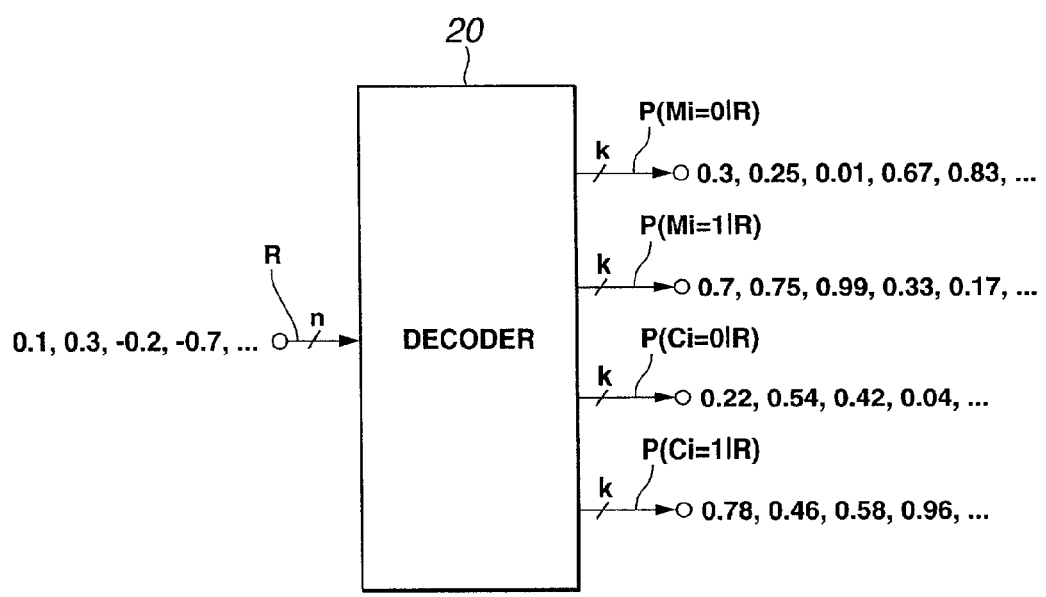
FIG. 7 illustrates an input/output example in a decoder applied to a reproducing system of the magnetic recording and/or reproducing apparatus shown in FIG. 5.
Figure 8:
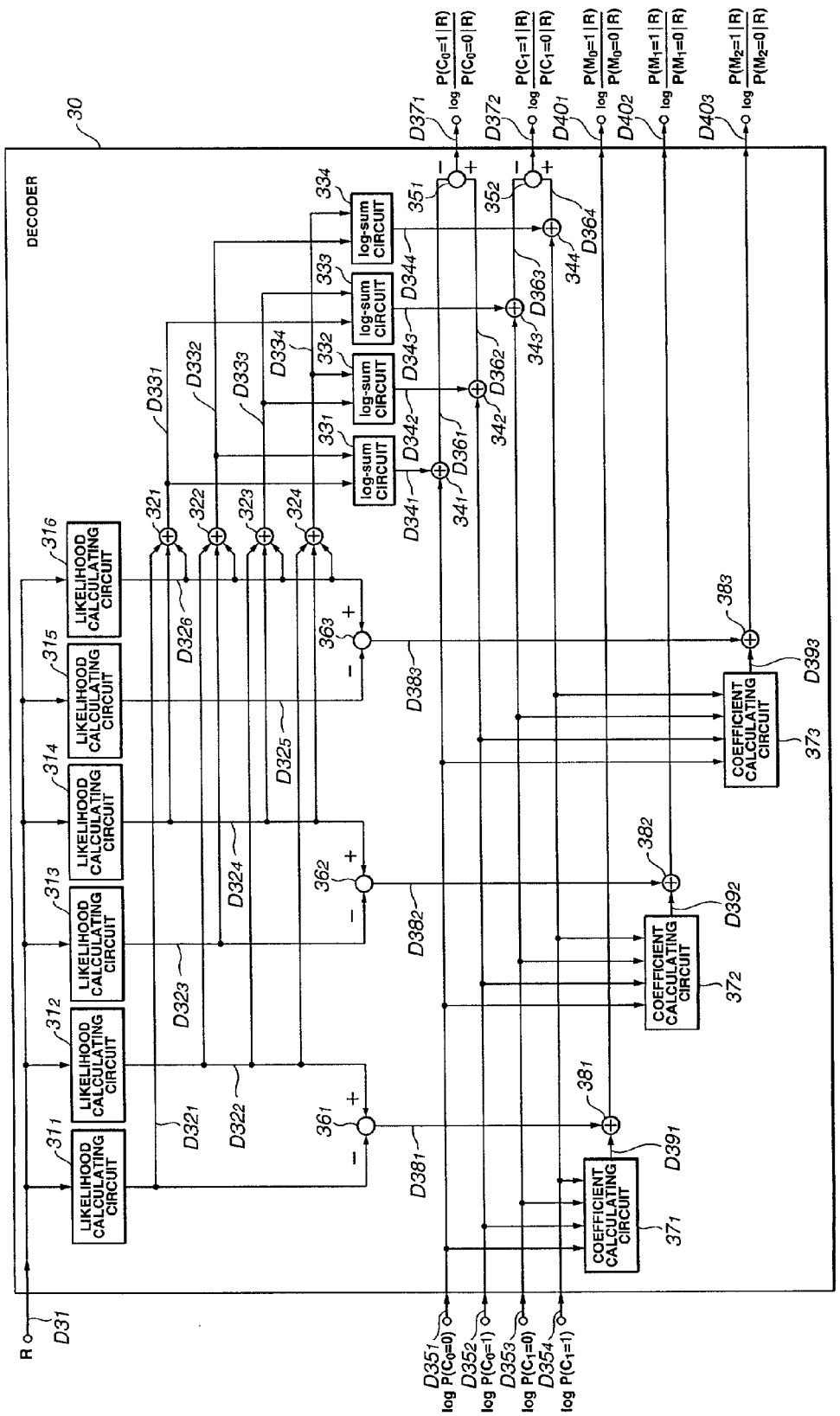
FIG. 8 is a block diagram for illustrating the structure of a decoder used in the reproducing system of the magnetic recording and/or reproducing apparatus shown in FIG. 5.

A decoder 20, shown in FIG. 7, decodes data encoded by block modulation, with the code rate R=k/n, where k is the number of input bits and n is the number of bits for modulation coding.

When fed with a reception signal R as the soft input, the decoder 20 calculates the probability $P(R_i=0|R)$ that the respective bits of this reception signal R are each "0" and the probability $P(R_i=1|R)$ that the respective bits of this reception signal R are each "1". Ultimately, the decoder 20 calculates a posterior probability information $P(M_i=0|R)$ and $P(M_i=1|R)$, as a soft decision value for a modulation code block M represented by $M=(M_0, M_1, \ldots, M_{n-1})$, and/or a posterior probability information $P(C_i=0|R)$ and $P(C_i=1|R)$, as a soft decision value for a modulation code input block C represented by $C=(C_0, C_1, \ldots, C_{k-1})$, to output the so-calculated information.

Instead of individually outputting the aforementioned posterior probability information, the decoder is also able to output the logarithmic value of the ratio of the posterior probability information, that is $\log(P(M_i=1|R)/P(M_i=0|R))$ or $\log(P(C_i=1|R)/P(C_i=0|R))$. These log values are routinely termed the log likelihood ratio and here denote the likelihood of the modulating code block M and the modulating code input block C on the occasion of inputting the reception signal R.

The decoder may also be fed with the priori probability information $P(C_i=0)$ and $P(C_i=1)$ for a modulation code input block C, instead of being fed with the aforementioned reception signal R.

Specifically, the decoder may, for example, be configured as shown in FIG. 8. In the following explanation, it is assumed that, for generating a three-bit output for a two-bit input, data to be decoded has been encoded in accordance with the conversion table shown in Table 3 given above.

The modulation decoder 30, shown in FIG. 8, includes six likelihood calculating circuits $31_1, 31_2, 31_3, 31_4, 31_5$ and $31_6$, as means for calculating the likelihood of each reception bit, four adders $32_1, 32_2, 32_3$ and $32_4$ for summing the data, four log-sum circuits $33_1, 33_2, 33_3$ and $33_4$ for performing the operations of $\log(e^A+e^B)$ on the two data A and B, four adders $34_1, 34_2, 34_3$ and $34_4$ for summing two data, five comparators $35_1, 35_2, 36_1, 36_2$ and $36_3$ for taking the ratio of the two data, coefficient calculating circuits $37_1, 37_2$ and $37_3$ for calculating coefficients for respective elements in the modulation encoding block M and three adders $38_1$, $38_2$ and $38_3$ for adding two data. It is noted that the number six of the likelihood calculating circuits is derived from three bits multiplied by 2 equals to six bits.

The likelihood calculating circuits $31_1, 31_2, 31_3, 31_4, 31_5$ and $31_6$ are respectively fed with respective reception bits in a reception signal D31 (R) to calculate the likelihood of the respective reception bits.

That is, the likelihood calculating circuits $31_1$ is fed with the 0th bit of the three-bit reception signal D31 to calculate the log probability value $D32_1$ ($\log P(R_0=0|R)$) corresponding to the log value of the probability that this bit is "0". The likelihood calculating circuits $31_1$ sends the generated log probability value $D32_1$ to the adder $32_1$.

The likelihood calculating circuits $31_2$ is fed with the 0th bit of the three-bit reception signal D31 to calculate the log probability value $D32_2$ (log $P(R_0=1|R)$) corresponding to the log value of the probability that this bit is "1". The likelihood calculating circuits $31_2$ sends the generated log probability value $D32_2$ to the adders $32_2$, $32_3$ and $32_4$ and to the comparator $36_1$.

Then, the likelihood calculating circuits $31_3$ is fed with the first bit of the three-bit reception signal D31 to calculate the log probability value $D32_3$ (log $P(R_1=0|R)$) corresponding to the log value of the probability that this bit is "0". The likelihood calculating circuits $31_3$ sends the generated log probability value $D32_3$ to the adder $32_2$ and to the comparator $36_2$.

The likelihood calculating circuits $31_4$ is fed with the first bit of the three-bit reception signal D31 to calculate the log probability value $D32_4$ (log $P(R_1=1|R)$) corresponding to the log value of the probability that this bit is "1". The likelihood calculating circuits $31_4$ sends the generated log probability value $D32_4$ to the adder $32_1$, $32_3$ and $32_4$ and to the comparator $36_2$.

Then, the likelihood calculating circuits $31_5$ is fed with the second bit of the three-bit reception signal D31 to calculate the log probability value $D32_5$ (log $P(R_2=0|R)$) corresponding to the log value of the probability that this bit is "0". The likelihood calculating circuits $31_5$ sends the generated log probability value $D32_5$ to the adder $32_4$ and to the comparator $36_3$.

The likelihood calculating circuits $31_6$ is fed with the second bit of the three-bit reception signal D31 to calculate the log probability value $D32_6$ (log $P(R_2=1|R)$) corresponding to the log value of the probability that this bit is "1". The likelihood calculating circuits $31_6$ sends the generated log probability value $D32_6$ to the adders $32_1$, $32_2$ and $32_3$ and to the comparator $36_3$.

The adder $D32_1$ sums the log probability value $D32_1$, supplied from the likelihood calculating circuits $31_1$, the log probability value $D32_4$, supplied from the likelihood calculating circuits $31_4$ and the log probability value $D32_6$, supplied from the likelihood calculating circuits $31_6$, to generate the likelihood value $D33_1$. That is, this likelihood value $D33_1$ is not other than the probability represented by log $P(R|M_0M_1M_2=011)$. The adder $D32_1$ sends the generated likelihood value $D33_1$ to the log-sum circuits $33_1$, $33_3$.

The adder $D32_2$ sums the log probability value $D32_2$, supplied from the likelihood calculating circuits $31_2$, the log probability value $D32_3$, supplied from the likelihood calculating circuits $31_3$ and the log probability value $D32_6$, supplied from the likelihood calculating circuits $31_6$ to generate the likelihood value $D33_2$. That is, this likelihood value $D33_2$ is not other than the probability represented by log $P(R|M_0M_1M_2=101)$. The adder $D32_2$ sends the generated likelihood value $D33_2$ to the log-sum circuits $33_1$, $33_4$.

The adder $D32_3$ sums the log probability value $D32_2$, supplied from the likelihood calculating circuits $31_2$, the log probability value $D32_4$, supplied from the likelihood calculating circuits $31_4$, and the log probability value $D32_6$, supplied from the likelihood calculating circuits $31_6$, to generate the likelihood value $D33_3$. That is, this likelihood value $D33_3$ is not other than the probability represented by log $P(R|M_0M_1M_2=111)$. The adder $D32_3$ sends the generated likelihood value $D33_3$ to the log-sum circuits $33_2$, $33_3$.

The adder $D32_4$ sums the log probability value $D32_2$, supplied from the likelihood calculating circuits $31_2$, the log probability value $D32_4$, supplied from the likelihood calculating circuits $31_4$ and the log probability value $D32_5$, supplied from the likelihood calculating circuits $31_5$, to generate the likelihood value $D33_4$. That is, this likelihood value $D33_4$ is not other than the probability represented by log $P(R|M_0M_1M_2=110)$. The adder $D32_4$ sends the generated likelihood value $D33_4$ to the log-sum circuits $33_2$, $33_4$.

The log-sum circuit $33_1$ performs an operation shown by the equation (4):

$$\log(e^{\log P(R|M_0M_1M_2=011)} + e^{\log P(R|M_0M_1M_2=101)}) = \log(P(R|M_0M_1M_2=011) + P(R|M_0M_1M_2=101)) \quad (4)$$

on the likelihood value $D33_1$ supplied from the adder $32_1$ and on the likelihood value $D33_2$ supplied from the adder $32_2$ to generate a likelihood value $D34_1$. The log-sum circuit $33_1$ sends the so-generated likelihood value $D34_1$ to the adder $34_1$.

The log-sum circuit $33_2$ performs an operation shown by the equation (5):

$$\log(e^{\log P(R|M_0M_1M_2=111)} + e^{\log P(R|M_0M_1M_2=110)}) = \log(P(R|M_0M_1M_2=111) + P(R|M_0M_1M_2=110)) \quad (5)$$

on the likelihood value $D33_3$ supplied from the adder $32_3$ and on the likelihood value $D33_4$ supplied from the adder $32_4$ to generate a likelihood value $D34_2$. The log-sum circuit $33_2$ sends the so-generated likelihood value $D34_2$ to the adder $34_2$.

The log-sum circuit $33_3$ performs an operation shown by the equation (6):

$$\log(e^{\log P(R|M_0M_1M_2=011)} + e^{\log P(R|M_0M_1M_2=111)}) = \log(P(R|M_0M_1M_2=011) + P(R|M_0M_1M_2=111)) \quad (6)$$

on the likelihood value $D33_1$ supplied from the adder $32_1$ and on the likelihood value $D33_3$ supplied from the adder $32_3$ to generate a likelihood value $D34_3$. The log-sum circuit $33_3$ sends the so-generated likelihood value $D34_3$ to the adder $34_3$.

The log-sum circuit $33_4$ performs an operation shown by the equation (7):

$$\log(e^{\log P(R|M_0M_1M_2=101)} + e^{\log P(R|M_0M_1M_2=110)}) = \log(P(R|M_0M_1M_2=101) + P(R|M_0M_1M_2=110)) \quad (7)$$

on the likelihood value $D33_2$ supplied from the adder $32_2$ and on the likelihood value $D33_4$ supplied from the adder $32_4$ to generate a likelihood value $D34_4$. The log-sum circuit $33_4$ sends the so-generated likelihood value $D34_4$ to the adder $34_4$.

The adder $34_1$ sums the likelihood value $D34_1$ supplied from the log-sum circuit $33_1$ and the log priori probability $D35_1$ (log $P(C_0=0)$) for an input bit, fed from outside, to generate the log probability value $D36_1$. This log probability value $D36_1$ denotes the probability shown by the following equation (8):

$$\log P(C_0=0|R) = \log \{P(R|M_0M_1M_2=011) + (R|M_0M_1M_2=101)\} + \log P(C_0=0) \quad (8).$$

The adder $34_1$ sends the generated log probability value $D36_1$ to a comparator $35_1$.

The adder $34_2$ sums the likelihood value $D34_2$ supplied from the log-sum circuit $33_2$ and the log priori probability $D35_2$ (log $P(C_0=1)$) for an input bit, input from outside, to generate the log probability value $D36_2$. This log probability value $D36_2$ denotes the probability shown by the following equation (9):

$$\log P(C_0=1|R) = \log \{P(R|M_0M_1M_2=111) + (R|M_0M_1M_2=110)\} + \log P(C_0=1) \quad (9).$$

The adder $34_2$ sends the generated log probability value $D36_2$ to a comparator $35_1$.

The adder $34_3$ sums the likelihood value $D34_3$ supplied from the log-sum circuit $33_3$ and the log priori probability $D35_3$ (log $P(C_1=0)$) for an input bit, input from outside, to generate the log probability value $D36_3$. This log probability value $D36_3$ denotes the probability shown by the following equation (10):

$$\log P(C_1=0|R) = \log \{P(R|M_0M_1M_2=011) + (R|M_0M_1M_2=111)\} + \log P(C_1=0) \quad (10).$$

The adder $34_3$ sends the generated log probability value $D36_3$ to the comparator $35_2$.

The adder $34_4$ sums the likelihood value $D34_4$ supplied from the log-sum circuit $33_4$ and the log priori probability $D35_4$ (log $P(C_1=1)$) for an input bit, input from outside, to generate the log probability value $D36_4$. This log probability value $D36_4$ denotes the probability shown by the following equation (11):

$$\log P(C_1=1|R) = \log \{P(R|M_0M_1M_2=101) + (R|M_0M_1M_2=110)\} + \log P(C_1=1) \quad (11).$$

The adder $34_4$ sends the generated log probability value $D36_4$ to a comparator $35_2$.

The comparator $35_1$ takes the ratio of the log probability value $D36_1$ supplied from the adder $34_1$ and the log probability value $D36_2$ supplied from the adder $34_2$ to generate the decoded log posterior probability ratio $D37_1$ ($\log(P(C_0=1|R)/P(C_0=0|R))$) which is output to outside.

The comparator $35_2$ takes the ratio of the log probability value $D36_3$ supplied from the adder $34_3$ and the log probability value $D36_4$ supplied from the adder $34_4$ to generate the decoded log posterior probability ratio $D37_2$ ($\log(P(C_1=1|R)/P(C_1=0|R))$) which is output to outside.

The comparator $36_1$ takes the ratio of the log probability value $D32_1$ supplied from the likelihood calculating circuit $31_1$ and the log probability value $D32_2$ supplied from the likelihood calculating circuit $31_2$ to generate the log posterior probability ratio $D38_1$ ($\log(P(M_0=1|R)/P(M_0=0|R))$) which is output to the adder $38_1$.

The comparator $36_2$ takes the ratio of the log probability value $D32_3$ supplied from the likelihood calculating circuit $31_3$ and the log probability value $D32_4$ supplied from the likelihood calculating circuit $31_4$ to generate the log posterior probability ratio $D38_2$ ($\log(P(M_1=1|R)/P(M_1=0|R))$) which is output to the adder $38_2$.

The comparator $36_3$ takes the ratio of the log probability value $D32_5$ supplied from the likelihood calculating circuit $31_5$ and the log probability value $D32_6$ supplied from the likelihood calculating circuit $31_6$ to generate the log posterior probability ratio $D38_3$ ($\log(P(M_2=1|R)/P(M_2=0|R))$) which is output to the adder $38_3$.

The coefficient calculating circuit $37_1$ calculates the $M_0$ coefficient, represented by the following equation (12):

$$\alpha = \log \frac{P(C_0=0) \cdot P(C_1=1) + P(C_0=1) \cdot P(C_1=0) + P(C_0=1) \cdot P(C_1=1)}{P(C_0=0) \cdot P(C_1=0)} \quad (12)$$

that is a coefficient $\alpha$ for the modulation code $M_0$ equivalent to the 0th bit making up the three-bit reception signal $D31$, based on the log priori probability $D35_1$, $D35_2$, $D35_3$ and $D35_4$ for the input bit supplied from outside, to generate a $M_0$ coefficient signal $D39_1$. The coefficient calculating circuit $37_1$ sends the generated $M_0$ coefficient $D39_1$ to the adder $38_1$.

The coefficient calculating circuit $37_2$ calculates the $M_1$ coefficient, represented by the following equation (13):

$$\beta = \log \frac{P(C_0=0) \cdot P(C_1=0) + P(C_0=1)P(C_1=0) + P(C_0=1) \cdot P(C_1=1)}{P(C_0=1) \cdot P(C_1=1)} \quad (13)$$

that is a coefficient $\beta$ for the modulation code $M_1$ equivalent to the first bit making up the three-bit reception signal $D31$, based on the log priori probability $D35_1$, $D35_2$, $D35_3$ and $D35_4$ for the input bit supplied from outside, to generate a $M_1$ coefficient signal $D39_2$. The coefficient calculating circuit $37_2$ sends the generated $M_1$ coefficient $D39_2$ to the adder $38_2$.

The coefficient calculating circuit $37_3$ calculates the $M_2$ coefficient, represented by the following equation (14):

$$\gamma = \log \frac{P(C_0=0) \cdot P(C_1=0) + P(C_0=0)P(C_1=1) + P(C_0=1) \cdot P(C_1=0)}{P(C_0=1) \cdot P(C_1=1)} \quad (14)$$

that is a coefficient $\gamma$ for the modulation code $M_2$ equivalent to the second bit making up the three-bit reception signal $D31$, based on the log priori probability $D35_1$, $D35_2$, $D35_3$ and $D35_4$ for the input bit supplied from outside, to generate a $M_2$ coefficient signal $D39_3$. The coefficient calculating circuit $37_3$ sends the generated $M_2$ coefficient $D39_3$ to the adder $38_3$.

The adder $38_1$ sums the log posterior probability ratio $D38_1$, supplied from the comparator $36_1$, to the $M_1$ coefficient signal $D39_1$ supplied from the coefficient calculating circuit $D37_1$. The adder $38_1$ outputs the decoded channel log posterior probability ratio signal $D40_1$($\log(P(M_0=1|R)/P(M_0=0|R))$) to outside.

The adder $38_2$ sums the log posterior probability ratio $D38_2$, supplied from the comparator $36_2$, to the $M_1$ coefficient signal $D39_2$ supplied from the coefficient calculating circuit $D37_2$. The adder $38_2$ outputs the decoded channel log posterior probability ratio signal $D40_2(\log(P(M_1=1|R)/P(M_1=0|R)))$ to outside.

The adder $38_3$ sums the log posterior probability ratio $D38_3$, supplied from the comparator $36_3$, to the $M_2$ coefficient signal $D39_3$ supplied from the coefficient calculating circuit $D37_3$. The adder $38_3$ outputs the decoded channel log posterior probability ratio signal $D40_3(\log(P(M_2=1|R)/P(M_2=0|R)))$ to outside.

The decoder 30, having the components as described above, has the likelihood calculating circuits $31_1$, $31_2$, $31_3$, $31_4$, $31_5$ and $31_6$ for calculating the likelihood of respective reception bits in the reception signals D31(R) taking analog values under the effect of the noise generated in the course of transmission, as soft input, that is the respective output codewords on the modulation coder side. By these likelihood calculating circuits $31_1$, $31_2$, $31_3$, $31_4$, $31_5$ and $31_6$, the modulation decoder 30 finds the likelihood of the respective codewords and uses the likelihood values, thus found, to find the posterior probability information straightforwardly, as soft decision values for the input and output bits on the modulation coder side.

Meanwhile, the decoder 30 is fed from outside with log priori probability $D35_1$, $D35_2$, $D35_3$, $D35_4$. If the probability of the respective bits making up the binary signal input to the modulation coder, not shown, being "0", is equivalent to the same probability being "1", there is no necessity of inputting the log priori probability $D35_1$, $D35_2$, $D35_3$, $D35_4$, it being only necessary to handle as if the values of these log priori probability $D35_1$, $D35_2$, $D35_3$, $D35_4$ are all equal to zero.

Although the above explanation is based on the assumption that the modulation decoder 30 decodes data obtained on modulation-coding a 2-bit input to a 3-bit output, the modulation decoder is not limited as to the number of bits of the input or the output and may be similarly configured in keeping with the number of bits of the input or the output used.

Figure 9:
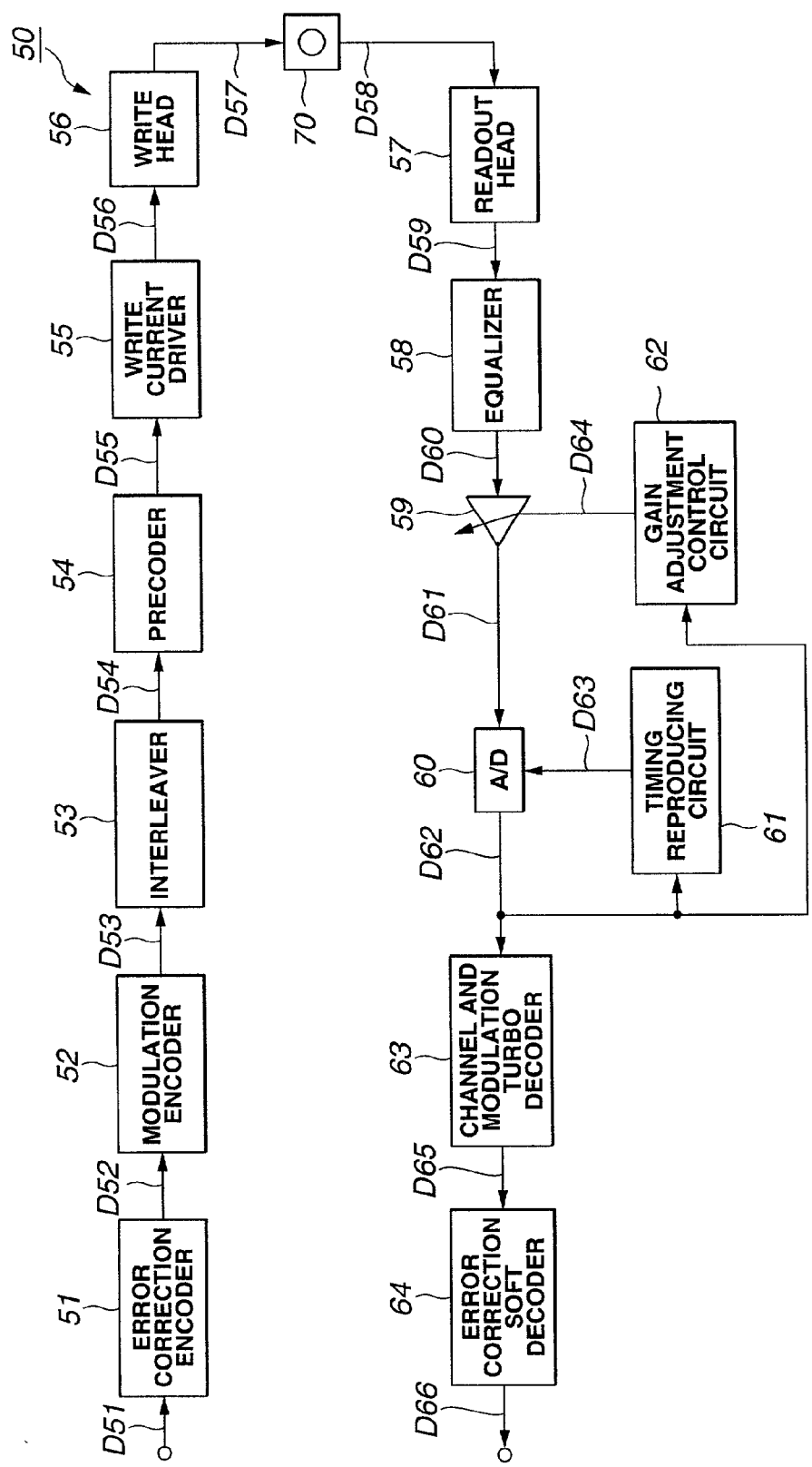
FIG. 9 is a block diagram for illustrating the structure of the recording and/or reproducing apparatus shown in FIG. 5.

Referring to FIG. 9, the magnetic recording and/or reproducing apparatus, employing this interleaver and decoder, is hereinafter explained.

A magnetic recording and/or reproducing apparatus 50, shown in FIG. 9, includes, as a recording system for recording data on a recording medium 70, an error correction coder 51 for error correction coding input data, a modulation coder 52 for modulation coding input data, an interleaver 53 for re-arraying the input data, a precoder 54 for filtering the input data for compensating for channel characteristics, a write current driver 55 for converting respective bits of the input data into write current values, and a write head 56 for recording data on a recording medium 70.

The error correction coder 51, as error correction encoding means, applies error correction coding to the input data D51. The error correction coder 51 sends the error correction encoded data D52, generated on error correction coding, to the downstream side modulation encoder 52.

The modulation encoder 52, as modulation encoding means, applies predetermined modulation coding to the error correction encoded data D52, supplied from the error correction coder 51, to generate modulation encoded data D53 as a string subjected to limitations. The modulation encoder 52 sends the so-generated modulation encoded data D53 to the downstream side interleaver 53.

The interleaver 53, as (first) interleaving means, is constructed as the aforementioned interleaver 10, interleaving the modulation encoded data D53, encoded with block modulation by the modulation encoder 52, on the modulation encoding block basis, to re-array the sequence of bits making up the modulation encoded data D53. The interleaver 53 sends the generated interleaved data D54 to the downstream side precoder 54.

The precoder 54 as preceding means filters the interleaved data D54, supplied from the interleaver 53, in such a manner as to compensate for channel characteristics from the data writing to the recording medium 70 to the outputting thereof in the equalizer 58 in the reproducing system, thereby generating a precode signal D55 as a binary signal. For example, if the channel has 1−D characteristics the precoder 54 performs filtering F represented by the following equation (15):

$$F=1/(1\oplus D) \qquad (15)$$

where ⊕ denotes exclusive-OR. The precoder 54 sends the generated precode signal D55 to the downstream side write current driver 55.

The write current driver 55 converts respective bits of the precode signal D55, supplied from the precoder 54, into the write current value $I_S$, so that 0 and 1 will be converted to $-I_S$ and $+I_S$ ($0 \rightarrow -I_S$, $1 \rightarrow +I_S$), respectively, to generate a write current signal D56. The write current driver 55 sends the so-generated write current signal D56 to the downstream side write head 56.

The write head 56 routes a write magnetic signal D57, conforming to the write current signal D56, supplied from the write current driver 55, to the recording medium 70 to record data thereon.

When recording data on the recording medium 70, the recording system in this magnetic recording and/or reproducing apparatus 50 applies error correction coding to the input data D51, by the error correction coder 51, to produce error correction coded data D52, which then is modulation-encoded in a predetermined fashion by the modulation coder 52. The so-produced modulation encoded data D53 is interleaved by the interleaver 53 on the modulation encoding block basis to produce precode signal D55 by the precoder 54.

The recording system records the precode signal D55, generated by the precoder 54, on the recording medium 70, through the write head 55 and the write head 56.

The recording system in the magnetic recording and/or reproducing apparatus includes the interleaver 53 downstream of the modulation encoder 52, and executes serial concatenated coding between the modulation encoder 52 and the precoder 54 to realize high performance encoding as encoding downstream of the error correction coding and encoding for the channel.

On the other hand, the magnetic recording and/or reproducing apparatus 50 includes, as a reproducing system for reproducing the data recorded on the recording medium 70, a readout head 57 for reading out data recorded on the recording medium 70, an equalizer 58 for equalizing input data, a gain adjustment circuit 59 for adjusting the gain of the input data, an analog/digital (A/D) converter 60 for converting analog data into digital data, a timing reproducing circuit 61 for reproducing clocks, a gain adjustment control circuit 62 for controlling the gain adjustment circuit 59, a channel and modulation turbo decoder 63 for applying turbo soft decoding to the input data, and an error correcting soft decoder 64 for applying error correcting soft decoding to the input data.

The readout head 57 reads out a readout magnetization signal D58 from the recording medium and generates a readout current signal D59 corresponding to this readout magnetization signal D58. The readout head 57 sends the generated readout current signal D59 to the downstream side equalizer 58.

The equalizer 58 equalizes the readout current signal D59, supplied from the readout head 57, so that the channel response from data writing on the recording medium 70 in the recording system up to outputting thereof in the equalizer 58 will be of pre-set characteristics, such as 1−D, to generate an equalized signal D60. The equalizer 58 sends the generated equalized signal D60 to the downstream side gain adjustment circuit 59.

The gain adjustment circuit 59 adjusts the gain of the equalized signal D60, supplied from the equalizer 58, based on the gain adjustment control signal D64 supplied from the gain adjustment control circuit 62, to generate a gain adjustment signal D61. The gain adjustment circuit 59 sends the generated gain adjustment signal D61 to the downstream side A/D converter 60.

The A/D converter 60 samples the gain adjustment signal D61, supplied from the gain adjustment circuit 59, based on the clock signal D63 supplied from the timing generating circuit 61, to digitize the gain adjustment signal D61 to generate a digital channel signal D62. The A/D converter 60 sends the so-generated digital channel signal D62 to the timing generating circuit 61, gain adjustment control circuit 62 and to the channel and modulation turbo decoder 63.

The timing generating circuit 61 regenerates clocks from the digital channel signal D62, supplied from the A/D converter 60, to generate clock signals D63. The timing generating circuit 61 routes the generated clock signals D63 to the A/D converter 60.

Based on the digital channel signal D62, supplied from the A/D converter 60, the gain adjustment control circuit 62 generates a gain adjustment control signal D64, which is a control signal used for maintaining the amplitude of the equalized signal D60 at an expected value. The gain adjustment control circuit 62 sends the generated gain adjustment control signal D64 to the gain adjustment circuit 59.

The channel and modulation turbo decoder 63 concatenates SISO decoders, constructed as the above-mentioned decoders 20, 30, to execute turbo decoding. The channel and modulation turbo decoder 63, explained later in detail, is fed with the digital channel signal D62, supplied from the A/D converter 60, to perform turbo decoding, and routes a so-generated turbo decoded signal D65 to the post-stage error correcting soft decoder 64.

The error correcting soft decoder 64, as error correction soft decoding means, applies the so-called BCJR (Bahl, Cocke, Jelinek and Rahiv) algorithm or the SOVA (soft output viterbi algorithm) to the turbo decoded signal D65, supplied from the channel and modulation turbo decoder 63, to output the soft-decoded signal as soft or hard output data D66.

The channel and modulation turbo decoder 63 will be explained in detail by referring to FIG. 10.

Figure 10:
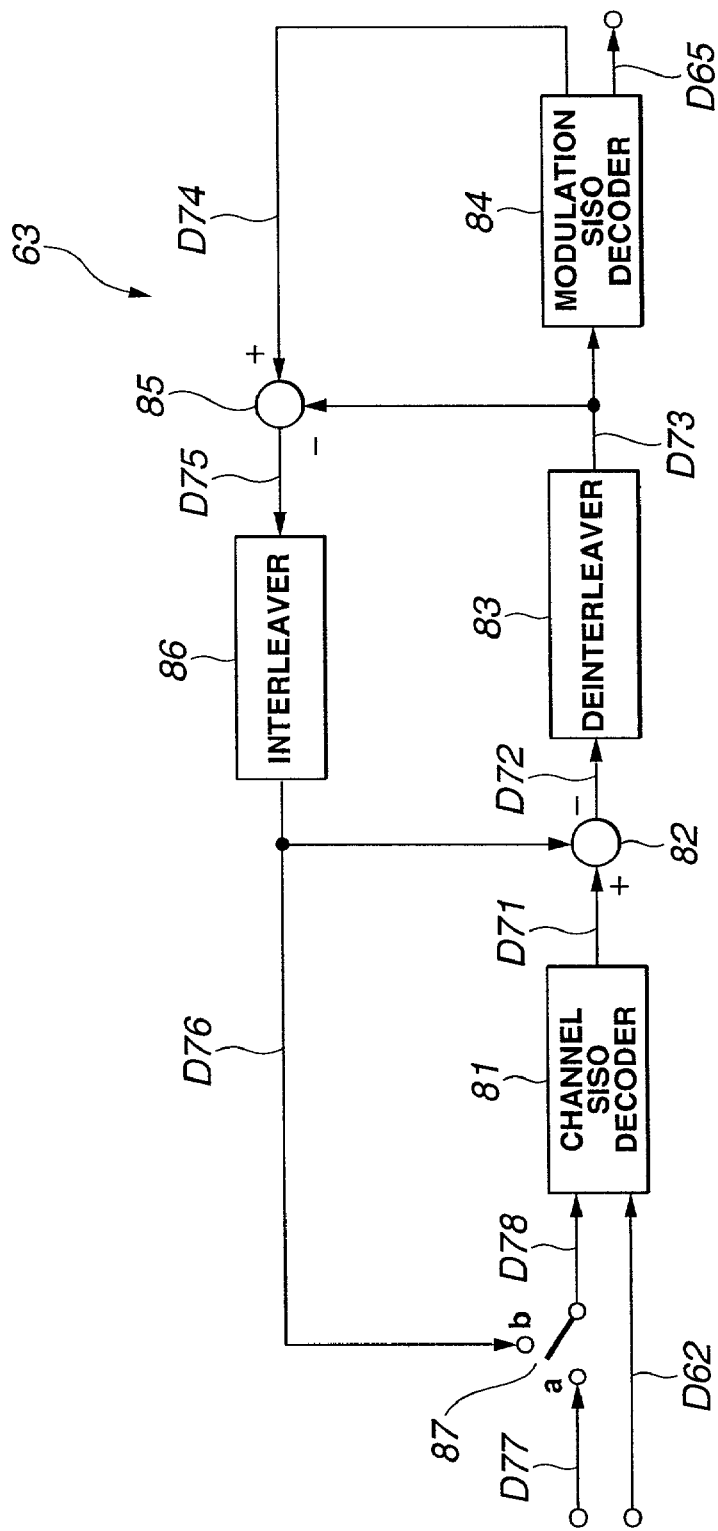
FIG. 10 is a block diagram for illustrating the structure of a channel and a modulation turbo decoder provided in the reproducing system of the recording and/or reproducing apparatus shown in FIG. 5.

Referring to FIG. 10, the channel and modulation turbo decoder 63 includes a channel SISO decoder 81, as an SISO type decoder for decoding the channel response from the pre-stage of the precoder 54 in the recording system up to the outputting stage of the equalizer 58 in the reproducing system, a deinterleaver 83 for restoring the sequence of the input data to the original sequence, a modulation SISO decoder 84, as a decoder of the SISO type for modulation decoding the input data, a deinterleaver 86 for re-arraying the input data, a changeover switch 87 for switching the data input as the priori probability information to information bits and two difference taking units 82, 85.

The channel SISO decoder 81, as channel decoding means, is constructed as the aforementioned decoders 20, 30, and is an SISO type decoder. The channel SISO decoder 81 is fed with the digital channel signal D62, as a soft input supplied from the A/D converter 60, and with the priori probability information D78, which is the priori probability information D76 for an information bit as a soft input supplied from the interleaver 86, or the priori probability information D77 for an information bit which is of a value "0", as selected by the changeover switch 87, and performs soft output decoding, based on the channel response $R_{ch}$ from the pre-stage of the precoder 54 in the recording system up to an output in the equalizer 58, represented by the following equation (13):

$$R_{ch}=(1-D)/(1 \oplus D) \tag{16}$$

where $\oplus$ denotes exclusive OR, in accordance with the aforementioned BCJR algorithm or SOVA. If the interleaved data D54 prior to the precoding by the precoder 54 is represented as C(t), with $0 \leq t \leq N$, the channel SISO decoder 81 computes the log posterior probability ratio log (P(C(t)=1)/P(C(t)=0)), as the posterior probability information for C(t), to route this log posterior probability ratio as the channel decoded signal D71 to the downstream side difference taking unit 82.

The channel SISO decoder 81 is not limited to the aforementioned decoders 20, 30, it being only sufficient if the channel SISO decoder 81 is constructed as an SISO decoder. For example, it is sufficient if the channel SISO decoder 81 performs soft output decoding, in accordance with the aforementioned BCJR algorithm or SOVA, based on the trellis corresponding to the channel response.

The difference taking unit 82 takes the difference between the channel decoded signal D71, as a soft input, supplied from the channel SISO decoder 81, and the priori probability information D76, as a soft input, supplied from the interleaver 86, to output data represented by the difference value as a soft output to the post-stage deinterleaver 83, as the channel extrinsic information signals D72 as the extrinsic information to an information bit as found by the code constraint condition. Meanwhile, this channel extrinsic information signals D72 corresponds to the interleaved data D54 as interleaved by the interleaver 53 of the recording system.

The deinterleaver 83, as deinterleaving means, deinterleaves the channel extrinsic information signals D72, as a soft input, supplied from the difference taking unit 82, in order to restore the bit sequence of the interleaved data D54 from the interleaver 53 of the recording system to the bit sequence of the original modulation encoded data D53. The deinterleaver 83 sends the deinterleaved data to the modulation SISO decoder 84 and to the difference taking unit 85 as the deinterleaved signal D73 which is the priori probability information to the code bit in the modulation SISO decoder 84.

The modulation SISO decoder 84 as modulation decoding means is constructed as the aforementioned decoders 20, 30 and is an SISO decoder. It is assumed that the modulation encoding is applied by the modulation coder 52 of the recording system with the code rate R=K/N, with the modulation encoded data D53 following modulation encoding by the modulation coder 52 being M(t) ($0 \leq t < N$) and with the error correction coded data D52 prior to modulation encoding by the modulation coder 52 being E(t) ($0 \leq t < K$). The modulation SISO decoder 84, fed as an input with the deinterleaved signal D73 from the deinterleaver 83, calculates the log posterior probability ratio log (P(M(t)=1)/P(M(t)=0)), as the posterior probability information for M(t), with the deinterleaved signal D73 as an input from the channel, and sends the log posterior probability ratio as the modulation channel decoded signal D74 to the difference taking unit 85. The modulation SISO decoder 84 also calculates the log posterior probability ratio log (P(E(t)=1)/P(E(t)=0)), as the posterior probability information for E(t), to route the log posterior probability ratio as the turbo decoded signal D65 to the error correcting soft decoder 64.

The difference taking unit 85 finds a difference value between the modulation channel decoded signal D74, as a soft input, supplied from the modulation SISO decoder 84, and the deinterleaved signal D73 as a soft input from the deinterleaver 83, and outputs data given as this difference value to the post-stage interleaver 86 as a soft output as the modulated extrinsic information signals D75 as the extrinsic information to the code bit as found by the constraint condition.

The interleaver 86, as the second interleaving means, interleaves the modulated extrinsic information signals D75, as a soft input fed from the difference taking unit 85, based on the same interleaving position information as that of the interleaver 53 of the recording system. The interleaver 86 sends the interleaved data to the channel SISO decoder 81 and to the difference taking unit 82 as being the priori probability information signal D76 for the information bit in the channel SISO decoder 81.

In the initial stage of the decoding, the changeover switch 87 is set to the fixed terminal a supplying a value 0 corresponding to the priori probability information signal D77 to select the priori probability information signal D77 as being the priori probability information signal D78 for an information bit in the channel SISO decoder 81. The changeover switch 87 then is set to a fixed terminal b supplying the priori probability information signal D76 supplied from the interleaver 86 to select the priori probability information signal D76 as being the priori probability information signal D78.

The channel and modulation turbo decoder 63, is provided with the modulation SISO decoder 84 and the channel SISO decoder 81, as counterparts to the modulation coder 52 and the precoder 54 of the recording system, respectively, as described above, to decompose the code of high decoding complexity into elements with lower decoding complexity, such as to sequentially improve characteristics by the interaction between the channel SISO decoder 81 and the modulation SISO decoder 84. If fed with the digital channel signal D62, as a soft input, from the A/D converter 60, the channel and modulation turbo decoder 63 iterates the decoding operations from the channel SISO decoder 81 to the modulation SISO decoder 84 a pre-set number of times, such as several to tens of times, to route the soft-output log posterior probability ratio, obtained on decoding a pre-set number of times, as the turbo decoded signal D65 to the post-stage error correcting soft decoder 64.

In reproducing data recorded on the recording medium 70, the reproducing system of the magnetic recording and/or reproducing apparatus 50 turbo-decodes the soft-input digital channel signal D62, generated through the readout head 57, equalizer 58, gain adjustment circuit 59 and the A/D converter 60, by the channel and modulation turbo decoder 63, to generate the turbo decoded signal D65 corresponding to the error correction coded data D52 input to the modulation coder 52 in the recording system.

This reproducing system soft-decodes the turbo decoded signal D65, generated by the channel and modulation turbo decoder 63, for error correction codes, by the error correcting soft decoder 64, to output data as resulting soft output directly to outside as output data D66, or binary-codes the soft-output data to generate hard-output data D66, which is issued to outside.

The reproducing system of the magnetic recording and/or reproducing apparatus 50 is provided in this manner with the channel and modulation turbo decoder 63 and performs turbo decoding between the modulation SISO decoder 84 and the channel SISO decoder 81 corresponding to the modulation coder 52 and the precoder 54 of the recording system to realize decoding in meeting with the channel response and the modulation encoding.

In the above-described magnetic recording and/or reproducing apparatus 50, in which the interleaver 53 is provided in the recording system on the post-stage of the modulation coder 52 to execute encoding by serial concatenated code between the modulation coder 52 and the precoder 54, while it is provided on the reproducing system with the channel and modulation turbo decoder 63 to effect turbo decoding to realize high performance coding. In addition, turbo decoding with high efficiency can be realized by exploiting soft information for the entire decoding processing for the code, thus eliminating the necessity of diminishing the information. The result is the appreciably lowered decoding error rate.

The second embodiment of the magnetic recording and/or reproducing apparatus is now explained. The magnetic recording and/or reproducing apparatus executes encoding as correlation is afforded to fore and aft side data instead of coding/decoding on the block basis. In addition, the magnetic recording and/or reproducing apparatus performs trellis decoding conforming to the constraint condition.

An interleaver used for the recording system of the magnetic recording and/or reproducing apparatus is first explained.

An interleaver applied to the recording system, such a one may be used which is configured similarly to the interleaver 10 shown in FIG. 5 and in which data is interleaved based on the modulation encoding block of the trellis to re-array the data bit sequence. It is assumed here that the bit sequence of the data from the modulation encoding of generating three output bits for two input bits in accordance with the conversion table shown in Table 3 by an interleaver. If the constraint condition to be met by the modulation encoded data is (d, k)=(0, 2) limitation, the interleaver generates a sequence meeting the (d, k)=(0, 4) limitation.

The interleaver is not limited to one interleaving the data based on the modulation encoding block of the trellis, such that any suitable interleaver interleaving the data such as to meet the pre-set constraint condition following interleaving may be used.

Referring to FIGS. 11 to 14, the encoder used in the recording system and the SISO decoder used for the reproducing system of the magnetic recording and/or reproducing apparatus is explained. It is noted that, although the coder and the decoder, used for modulation encoding and modulation decoding, respectively, are shown here, the coder and the decoder for the channel are configured in a similar fashion.

The magnetic recording and/or reproducing apparatus performs modulation encoding and modulation decoding, based on a common trellis. Although the trellis structure is changed depending on limitations imposed on the modulation code, the modulation encoding and modulation decoding, satisfying the (d, k)=(0, 2) limitations, with the code rate R=2/3, is here explained.

Figure 11:
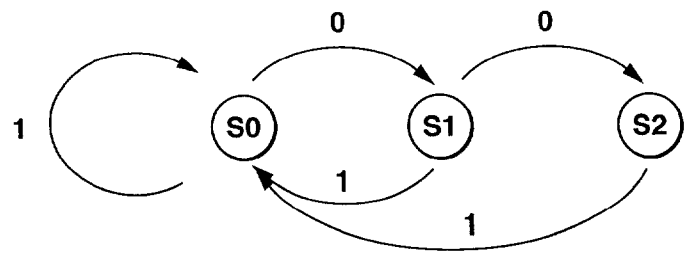
FIG. 11 illustrates the status transition diagram for generating codes satisfying the (d, k)=(0, 2) limitations.

FIG. 11 shows a diagram showing the status transition for generating satisfying the (d, k)=(0, 2) limitations. In FIG. 11, labels affixed between the respective states indicate bits output in case of status transition. For example, if the status transition that has occurred is "S0→S1→S2", an output bit string is "00". The bit string output in case status transition has occurred in accordance with the aforementioned status transition diagram necessarily satisfies the (d, k)=(0, 2) limitations.

Assume that the modulation encoding of outputting a 3 bit modulated code for a 2-bit input, with the code rate R=2/3. For generating the modulation code satisfying the (d, k)=(0, 2) limitations, it is apparently sufficient if status transition occurs thrice in accordance with the status transition diagram shown in FIG. 11, with the resulting output being a modulated code.

Figure 12:
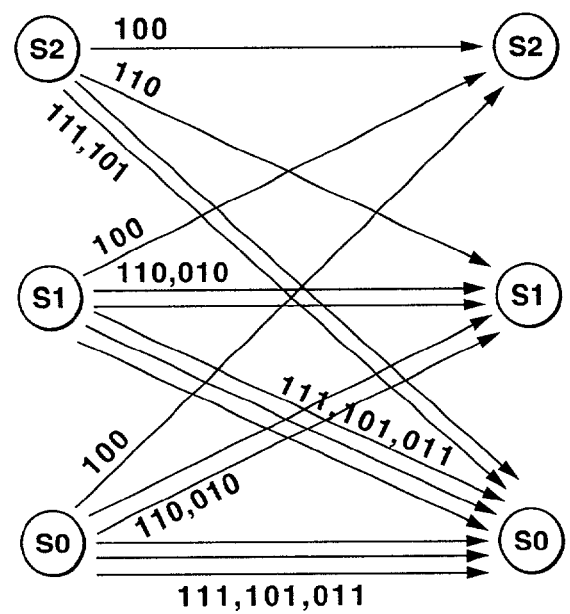
FIG. 12 illustrates the trellis when status transition has occurred thrice in accordance with the status transition diagram shown in FIG. 11.

The trellis when the status transition has occurred thrice in accordance with the status transition diagram shown in FIG. 11, that is, a diagram obtained on developing the status transition diagram along the time axis direction, is as shown in FIG. 12. For example, in the trellis shown in FIG. 12, a branch lying at an uppermost position indicates that there is one path starting at the status S2 and again getting to the status S2 after three status transitions, with a corresponding output being "100".

Figure 13:
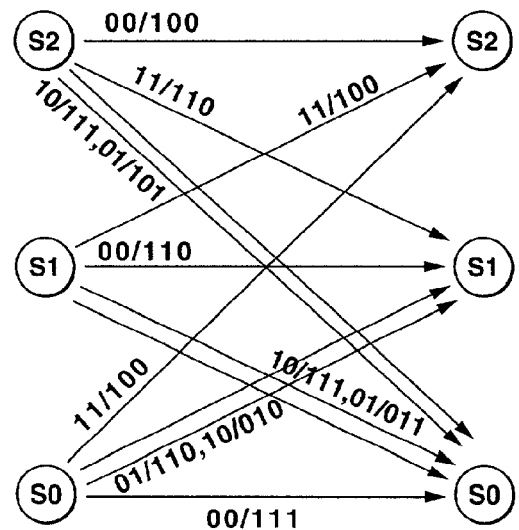
FIG. 13 illustrates the trellis constructed on branch selection from the trellis shown in FIG. 12.

In case of modulation encoding of outputting 3-bit modulated code for a 2-bit input, $2^2$=4 branches are selected from each state, these branches being then allocated to 2-bit inputs of "00, 01, 10, 11" to form a trellis in which an input is associated with an output. FIG. 13 shows a trellis formed on branch selection as described above. In FIG. 13, each label affixed between different states indicate an input/output. For example, in the trellis shown in FIG. 13, a branch S0→S2 indicates that, if "11" is input for the state S0, status transition occurs to the status S2, as "100" is output.

The encoder, applied to the magnetic recording and/or reproducing apparatus, shown as the second embodiment, repeats the status transition for encoding, in accordance with the trellis formed by the above-described sequence of operations, to generate a modulated code string having correlation between input data. The encoder may be provided with components shown for example in FIG. 14.

Figure 14:
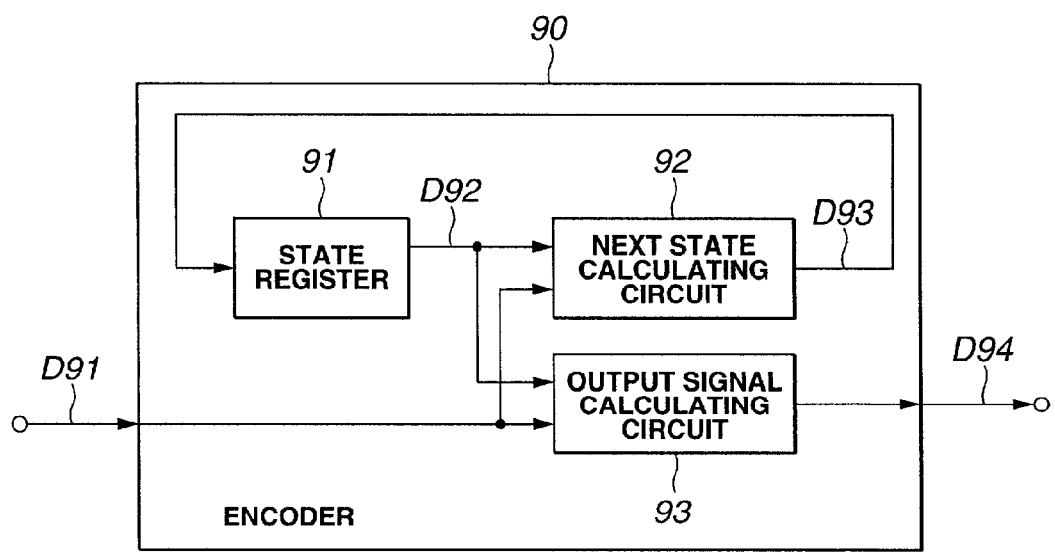
FIG. 14 is a block diagram showing the structure of an encoder used in a recording system of a magnetic recording and/or reproducing apparatus shown as a second embodiment of the present invention.

The encoder 90, shown in FIG. 14, includes a state register 91 for holding the state of the encoder 90, a next-state calculating circuit 92, for calculating the next transition state, and an output signal calculating circuit 93 for calculating an output signal D94.

The state register 91 is a 2-bit register holding 2 bits specifying the state of the current encoder 90. The state register 91 sends a status signal D92, specifying the 2 bits indicating the current state, to the next-state calculating circuit 92 and to the output signal calculating circuit 93, as the state register 91 holds 2 bits indicating the next state corresponding to the next state signal D93 supplied from the next-state calculating circuit 92.

When fed with the input signal D91 and with the status signal D92, supplied from the state register 91, the next-state calculating circuit 92 calculates the next state in accordance with the following input/output correlating table 4:

TABLE 4

Typical Input/Output Correlating Table

| status signals | input signals | next-state signals |
|---|---|---|
| 0 | 00 | 0 |
| 0 | 01 | 1 |
| 0 | 10 | 1 |
| 0 | 11 | 2 |
| 1 | 00 | 1 |
| 1 | 01 | 0 |
| 1 | 10 | 0 |
| 1 | 11 | 2 |
| 2 | 00 | 2 |
| 2 | 01 | 0 |
| 2 | 10 | 0 |
| 2 | 11 | 1 |
| 3 | 00 | 0 |
| 3 | 01 | 0 |
| 3 | 10 | 0 |
| 3 | 11 | 0 |

The next-state calculating circuit 92 sends the next state signal D93 to the state register 91.

If fed with the input signal D91 and with the status signal D92, supplied from the state register 91, the output signal calculating circuit 93 calculates an output signal D94, in accordance with the following input/output correlating table 5:

TABLE 5

Typical Input/Output Correlating Table

| status signals | input signals | output signals |
|---|---|---|
| 0 | 00 | 111 |
| 0 | 01 | 110 |
| 0 | 10 | 010 |
| 0 | 11 | 100 |
| 1 | 00 | 110 |
| 1 | 01 | 011 |
| 1 | 10 | 111 |
| 1 | 11 | 100 |
| 2 | 00 | 100 |
| 2 | 01 | 101 |
| 2 | 10 | 111 |
| 2 | 11 | 110 |
| 3 | 00 | 111 |
| 3 | 01 | 111 |
| 3 | 10 | 111 |
| 3 | 11 | 111 |

Meanwhile, this output signal D94 satisfies the (d, k)=(0, 2) limitations.

When fed with the input signal D91, the encoder 90 calculates the next state, using this input signal D91 and the status signal D92, by the next-state calculating circuit 92, for storage sequentially in the state register 91. The encoder 90 calculates an output signal D94, by the output signal calculating circuit 93, using the input signal D91 and the status signal D92, by the output signal calculating circuit 93, to output the so-calculated output signal D94.

Since there lacks the status S3 in the encoder 90, if transition to the status S3 occurs before the resetting of the encoder 90, an output signal "111" is instantly output as an output signal D94, based on the Table 5, to realize the function of resetting to the state S0.

A decoder for modulation decoding the signal, encoded by the above-described encoder, applies the decoding, which is based on the BCJR or SOVA algorithm, in accordance with the trellis previously explained with reference to FIG.

13. With this decoder, the magnetic recording and/or reproducing apparatus is able to perform trellis decoding exploiting the signal correlation in the modulation encoder.

In particular, if, in performing trellis decoding in the magnetic recording and/or reproducing apparatus, SISO decoding of the BCJR or SOVA algorithm is used in the decoder, the soft information can be output to the error correction decoding circuit provided downstream of the modulation decoder, thereby improving the decoding error rate.

The magnetic recording and/or reproducing apparatus, employing this type of the encoder and the decoder, is hereinafter explained with reference to FIG. 15.

Figure 15:
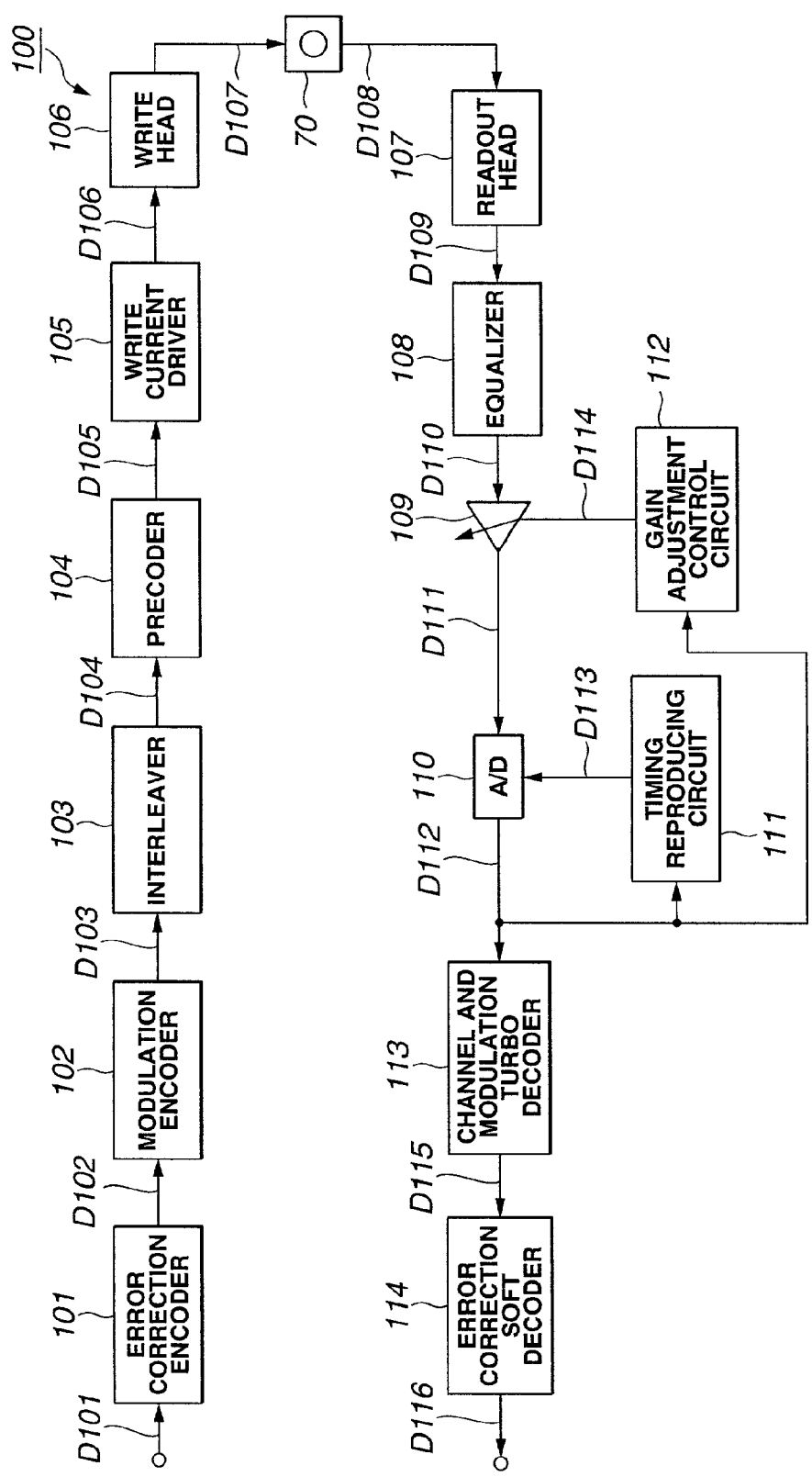
FIG. 15 is a block diagram for illustrating the structure of the magnetic recording and/or reproducing apparatus.

The magnetic recording and/or reproducing apparatus 100, shown in FIG. 15, includes, as a recording system for recording data on a recording medium 70, an error correction encoder 101 for error correction encoding input data, a modulation encoder 101, a modulation encoder 102 for modulation encoding input data, an interleaver 103 for re-arraying the input data in its sequence, a precoder 104 for filtering input data for compensating its channel characteristics, a write current driver 105 for converting respective bits of the input data into write current values, and a write head 106 for recording data on the recording medium 70.

Similarly to the error correction coder 51 in the magnetic recording and/or reproducing apparatus 50, the error correction encoder 101, as error correcting encoding means, error correction encodes the input data D101. The error correction encoder 101 sends the error correction encoded data D102 to the downstream side modulation encoder 102.

The modulation encoder 102, as modulation encoding means, is configured as the aforementioned modulation encoder 90. Specifically, it is a modulation encoder for repeating status transitions in accordance with the trellis, by way of encoding, for generating a modulated code string exhibiting correlation between input data. The modulation encoder 102 applies pre-set trellis modulation coding to the error correction coded data D102, supplied from the error correction encoder 101, to generate modulated encoded data D103 as a string subjected to limitation. The modulation encoder 102 sends the generated modulation encoded data D103 to the downstream side interleaver 103.

The interleaver 103, as (first) interleaving means, interleaves the modulated encoded data D103 in terms of the trellis modulation encoding block as a unit, to re-array the sequence of bits making up the modulated encoded data D103. The interleaver 103 sends the generated interleaved data D104 to the downstream side precoder 104.

Similarly to the precoder 54 of the aforementioned magnetic recording and/or reproducing apparatus 50, the precoder 104 filters the interleaved data D104, supplied from the interleaver 103, in such a manner as to compensate for channel characteristics from the data writing to the recording medium 70 to the output in the equalizer 108 in the reproducing system, thereby generating a precode signal D105 as a binary signal. The precoder 104 sends the so-generated precede signal D105 to the downstream side write current driver 105.

Similarly to the write current driver 55 in the aforementioned magnetic recording and/or reproducing apparatus 50, the write current driver 105 converts respective bits of the precode signal D104, supplied from the precoder 103, into the write current value $I_S$, to generate a write current signal D106. The write current driver 105 sends the generated write current signal D106 to a downstream side write head 106.

Similarly to the write head 56 in the aforementioned magnetic recording and/or reproducing apparatus 50, the write head 106 applies a magnetic write signal D107, corresponding to the write current signal D106 supplied from the write current driver 105, to the recording medium 70, to record data thereon.

In recording data on the recording medium 70, the recording system in the magnetic recording and/or reproducing apparatus 100 error correction encodes the input data D101 by the error correction encoder 101. The recording system then applies pre-set trellis modulation encoding to error correction encoded data D102 by the modulation encoder 102 and interleaves the modulated encoded data D103 by the interleaver 103 based on the pre-set trellis modulation encoding block to generate a precede signal D105 by the precoder 104.

The recording system records the precode signal D105, generated by the precoder 104, on the recording medium 70, by the write current driver 105 and the write head 106.

The recording system of the magnetic recording and/or reproducing apparatus 100, thus having the interleaver 103 downstream of the modulation encoder 102, effects encoding by serial concatenated coding between the modulation encoder 102 and the precoder 104 to realize high performance coding as modulation encoding and channel coding downstream of the error correction coding.

As the reproducing system for reproducing data recorded on the recording medium 70, the magnetic recording and/or reproducing apparatus 100 includes a readout head 107 for reading out data recorded on the recording medium 70, an equalizer 108 for equalizing input data, a gain adjustment circuit 109 for adjusting the gain of the input data, an A/D circuit 110 for converting analog data to digital data, a timing circuit 111 for reproducing clocks, a gain adjustment control circuit 112 for controlling the gain adjustment circuit 109, a modulation turbo decoder 113 for turbo-decoding the input data and an error correction soft decoder 104 for error correction soft decoding the input data.

Similarly to the readout head 57 of the magnetic recording and/or reproducing apparatus 50, a readout head 107 reads out the readout magnetization signal D108 from the recording medium 70 to generate a readout current signal D109 conforming to the readout magnetization signal D108. The readout head 107 sends the so-generated current signal D109 to the downstream side equalizer 108.

Similarly to the equalizer 58 of the magnetic recording and/or reproducing apparatus 50, the equalizer 108 equalizes the readout current signal D109, supplied from the readout head 107, so that the channel response from the data writing on the recording medium 70 in the recording system up to the outputting at the equalizer 108 will be of pre-set characteristics, to generate an equalized signal D110. The equalizer 108 routes the generated equalized signal D110 to the downstream side gain adjustment circuit 109.

Similarly to the gain adjustment circuit 59 Of the magnetic recording and/or reproducing apparatus 50, the gain adjustment circuit 109 adjusts the gain of the equalized signal D110 supplied from the equalizer 108, based on a gain adjustment control signal D114, supplied from the gain adjustment control circuit 112, to generate a gain adjustment signal D111. The gain adjustment circuit 109 routes the generated gain adjustment signal D111 to the downstream side A/D converter 110.

Similarly to the A/D converter 60 of the magnetic recording and/or reproducing apparatus 50, the A/D converter 110 samples and digitizes the gain adjustment signal D111, supplied from the gain adjustment circuit 109, based on the clock signal D113, supplied from the timing regenerating circuit 111, to generate a digital channel signal D112. The A/D converter 110 sends the generated digital channel signal D112 to the timing regenerating circuit 111, gain adjustment control circuit 112 and to the channel and modulation turbo decoder 113.

Similarly to the timing generating circuit 61 of the magnetic recording and/or reproducing apparatus 50, the timing regenerating circuit 111 regenerates clocks from the digital channel signal D112 supplied from the A/ID converter 110 to generate clock signals D113. The timing regenerating circuit 111 sends the generated clock signals D113 to the A/D converter 110.

Similarly to the gain adjustment control circuit 62 of the magnetic recording and/or reproducing apparatus 50, the gain adjustment control circuit 112 generates, based on the digital channel signal D112, supplied from the A/D converter 110, a gain adjustment control signal D114, which is a control signal used for maintaining the amplitude of the equalized signal D110 at an expected value. The gain adjustment control circuit 112 sends the generated gain adjustment control signal D114 to the gain adjustment circuit 109.

Similarly to the channel and modulation turbo decoder 63 of the magnetic recording and/or reproducing apparatus 50, the channel and modulation turbo decoder 113, is comprised of concatenated SISO decoders to effect turbo decoding. The channel and modulation turbo decoder 113 turbo-decodes the input digital channel signal D112 from the A/D converter 110 to route the generated turbo decoded signal D115 to the downstream side error correction decoder 114.

Similarly to the error correction soft decoder 54 of the magnetic recording and/or reproducing apparatus 50, the error correction soft decoder 114, as error correcting soft decoding means, soft-decoded the turbo decoded signal D115 supplied from the modulation SISO decoder 113 for errors based on the BCJR algorithm or SOVA to output soft or hard output data D116 to outside.

Figure 16:
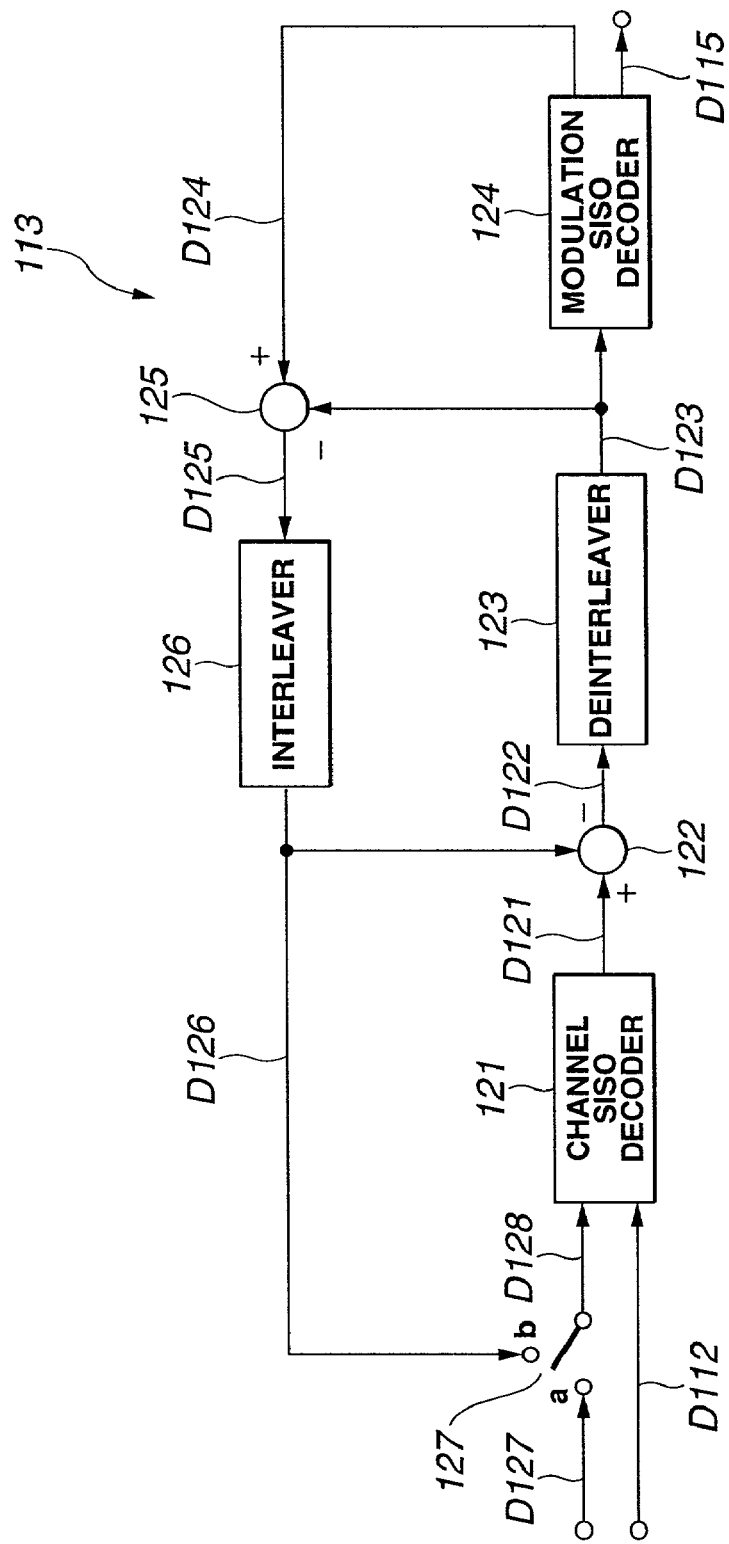
FIG. 16 is a block diagram for illustrating the structure of the channel and a modulation turbo decoder provided in a reproducing system of the magnetic recording and/or reproducing apparatus.

Referring to FIG. 16, the channel and modulation turbo decoder 113 is explained in detail.

In this figure, the channel and modulation turbo decoder 113 includes a channel SISO decoder 121, as an SISO decoder for decoding the channel response from the pre-stage of the precoder 104 in the recording system to the outputting in the equalizer 108, a deinterleaver 123 for restoring the sequence of the input data, an SISO decoder 124, as a SISO decoder for modulation decoding the input data, an interleaver 126 for re-arraying the sequence of the input data, a changeover switch 127 for changing over input data input as the priori probability information for information bits and two difference taking units 122, 125.

The channel SISO decoder 121, as channel decoding means, is fed with the digital channel signal D112, as a soft input supplied from the A/D converter 110, and with priori probability information D128, as selected by the changeover switch 127 from the priori probability information D126 for information bits supplied as soft input from the A/D converter 110 and the priori probability information D127 for information bits having a value of "0", to effect soft output decoding, based on the BCJR algorithm or SOVA, in accordance with the trellis for the channel response from the parentage of the precoder 104 in the recording system to an output in the equalizer 108 in the reproducing system. If the interleaved data D104 prior to precoding by the precoder 104 is expressed as C(t) (0≦t≦N), the channel SISO decoder 121 calculates the log posterior probability ratio log (P(C(t)=1)/P(C(t)=0)), as the posterior probability information for this C(t), to send this log posterior probability ratio as the channel decoded signal D121 to the downstream side difference taking unit 122.

The difference taking unit 122 finds a difference between the channel decoded signal D121, as soft input, supplied from the channel SISO decoder 121, and the priori probability information D126, as soft input, supplied from the interleaver 126, to output data corresponding to this difference value as soft output to the downstream side deinterleaver 123 as the channel extrinsic information signals D122 for an information bit as found by the code constraint condition. Meanwhile, the channel extrinsic information signals D122 corresponds to the interleaved data D104 obtained on interleaving by the interleaver 103 in the recording system.

The deinterleaver 123, as deinterleaving means, deinterleaves the bit sequence of the interleaved data D104 from the interleaver 103 of the recording system to the channel extrinsic information signals D122 supplied from the difference taking unit 122 in order to restore the bit sequence to that of the original modulated encoded data D103. The deinterleaver 123 sends the deinterleaved data to the modulation SISO decoder 124 and to the difference taking unit 122 as the deinterleaved signal D123 which is the priori probability information for the code bits in the modulation SISO decoder 124.

The modulation SISO decoder 124, as modulation decoding means, decodes signals encoded by the modulation encoder 102 in the recording system, and is an SISO type modulation decoder. The modulation encoded data D103, obtained on modulation encoding by the modulation encoder 102 with a code rate R=K/N, is specified as M(t) (0≦t<N) and the error correction encoded data D102 prior to modulation encoding by the modulation encoder 102 is specified as E(t) (0≦t<K). The modulation SISO decoder 124 is fed with the deinterleaved signal D123, supplied as soft input from the deinterleaver 123, and calculates the log posterior probability ratio log (P(M(t)=1)/P(M(t)=0)), as posterior probability information for M(t), using the trellis corresponding to the constraint condition, to send the so-calculated log posterior probability ratio as the modulation channel decoded signal D124 to the difference taking unit 125. The modulation SISO decoder 124 also calculates the log posterior probability ratio log (P(E(t)=1)/P(E(t)=0)), as posterior probability information for E(t), to send the so-calculated log posterior probability ratio as the turbo decoded signal D115 to the error correction soft decoder 114.

The difference taking unit 125 finds a difference between the modulation channel decoded signal D124, supplied as soft input from the modulation SISO decoder 124, and the deinterleaved signal D123, supplied as soft input from the deinterleaver 123, to output the data as the difference value as soft output to the downstream side interleaver 126 as the modulated extrinsic information signals D125, which is the extrinsic information for a code bit as found by the code constraint condition.

The interleaver 126, as second interleaving means, interleaves the modulated extrinsic information signals D125, supplied from the difference taking unit 125, based on the same interleaving position information as that of the interleaver 103 of the recording system. The interleaver 126 sends the interleaved data to the channel SISO decoder 121 and to the difference taking unit 122 as being the priori probability information signal D126 for the information bit in the channel SISO decoder 121.

In the initial stage of the decoding, the changeover switch 127 is set to the fixed terminal c supplying a value 0 corresponding to the priori probability information signal D127 to select the priori probability information signal D127 as being the priori probability information signal D128 for an information bit in the channel SISO decoder 121. The changeover switch 127 then is set to a fixed terminal d supplying the priori probability information signal D126 supplied from the interleaver 126 to select the priori probability information signal D126 as being the priori probability information signal D128.

Similarly to the channel and modulation turbo decoder 63 in the previously described magnetic recording and/or reproducing apparatus, the channel and modulation turbo decoder 113, is provided with the modulation SISO decoder 124 and the channel SISO decoder 121, as counterparts to the modulation coder 102 and the precoder 104 of the recording system, respectively, as described above, to decompose the code of high decoding complexity into elements with lower decoding complexity, such as to sequentially improve characteristics by the interaction between the channel SISO decoder 121 and the modulation SISO decoder 124. If fed with the digital channel signal D112, as a soft input, from the A/D converter 110, the channel and modulation turbo decoder 113 iterates the decoding operations from the channel SISO decoder 121 to the modulation SISO decoder 124 a pre-set number of times, such as several to tens of times, to route the soft-output log posterior probability ratio, obtained on decoding a pre-set number of times, as the turbo decoded signal D115 to the post-stage error correcting soft decoder 64.

In reproducing data recorded on the recording medium 70, the reproducing system of the magnetic recording and/or reproducing apparatus 50 turbo-decodes the soft-input digital channel signal D112, generated through the readout head 107, equalizer 108, gain adjustment circuit 109 and the A/D converter 110, by the channel and modulation turbo decoder 113, to generate the turbo decoded signal D115 corresponding to the error correction coded data D102 input to the modulation coder 102 in the recording system.

This reproducing system soft-decodes error correction codes of the turbo decoded signal D115, generated by the channel and modulation turbo decoder 113, by the error correcting soft decoder 114, to output data as resulting soft output directly to outside as output data D116, or binary-codes the soft-output data to generate hard-output data D116 which is issued to outside.

The reproducing system of the magnetic recording and/or reproducing apparatus 100 is provided in this manner with the channel and modulation turbo decoder 113 and performs turbo decoding between the modulation SISO decoder 124 and the channel SISO decoder 121 corresponding to the modulation coder 102 and the precoder 104 of the recording system to realize decoding in meeting with the channel response and the modulation encoding.

The magnetic recording and/or reproducing apparatus 100 includes, in its recording system, the interleaver 103 downstream oft the modulation encoder 102, to effect encoding by serial concatenated code between the modulation encoder 102 and the precoder 104, while including, on its reproducing side, the channel and modulation turbo decoder 113 to effect turbo decoding to realize high performance coding as well as highly efficient turbo decoding exploiting the soft information for the entire decoding processing for the code. Since there is no necessity of diminishing the information, the decoding error rate can be lowered significantly. Moreover, the magnetic recording and/or reproducing apparatus 100 effects coding in the recording system, as correlation is afforded to the fore and aft side data. In addition, trellis decoding can be performed on the reproducing side in meeting with the constraint condition, thus further lowering the decoding error rate.

The above-described magnetic recording and/or reproducing apparatus 50, 100 are able to perform efficient turbo decoding by exploiting the soft information, thereby lowering the decoding error rate. In particular, with the magnetic recording and/or reproducing apparatus 100, encoding can be made as correlation is afforded to the fore and aft side data, without doing block-based encoding or decoding, while trellis decoding can be made in meeting with the constraint conditions, thus further lowering the decoding error rate. That is, the magnetic recording and/or reproducing apparatus 50, 100 is able to realize high precision decoding, thus assuring high operational reliability fort the user.

The present invention is not limited to the above-described embodiment. For example, the present invention may be applied to a recording medium 70 other than the recording medium of the magnetic recording system, that is to a recording medium by the optical recording system, such as a so-called CD (Compact Disc) or to the DVD (Digital Versatile Disc) or to a recording medium of the photomagnetic recording system, such as a so-called magneto-optical disc (MO) disc.

In the above-described embodiment, it is assumed that the magnetic recording and/or reproducing apparatus 100 performs trellis modulation encoding on the encoder side and trellis modulation decoding on the decoder side. However, the present invention is applicable to such a case wherein the trellis modulation decoding is performed on the decoder side to output a soft decision value even in case the trellis modulation encoding is not performed on the encoding side, as when block modulation is effected on the encoder side.

Moreover, in the above-described embodiment, it is assumed that the magnetic recording and/or reproducing apparatus 50 or 100 is a unitary apparatus provided with the recording and reproducing systems. Alternatively, a unitary recording apparatus may be configured as a recording system for recording data on a recording medium, while a unitary reproducing apparatus may also be configured as a reproducing system for reproducing the data recorded on the recording apparatus.

In the foregoing, the present invention has been disclosed only by way of illustration and should not be interpreted in a limiting fashion. The scope of the present invention is to be interpreted in light of the description of the following claims.

What is claimed is:

1. A data reproducing apparatus for reproducing data recorded by a recording equipment for recording data on a recording medium, the recording equipment including modulation encoding means for applying predetermined modulation encoding to input data, the input data having a bit sequence, wherein said modulation encoding means encodes the input data in accordance with a constraint condition by block modulation, and first interleaving means for interleaving data supplied from said modulation encoding means for re-arraying a data sequence corresponding to said data supplied from said modulation encoding means, said data reproduction apparatus comprising:

deinterleaving means for deinterleaving reproduced data in a sequence such as to restore the data sequence to the bit sequence;

modulation decoding means for modulation decoding data supplied from said deinterleaving means in conformance with said constraint condition, wherein said modulation decoding means includes likelihood calculating means for calculating a likelihood value corresponding to output codewords output by said modulation encoding means, wherein posterior probability information as a soft decision value for an input bit to said modulation encoding means and an output bit from said modulation encoding means is calculated using said likelihood value as calculated by said likelihood calculating means; and second interleaving means for interleaving difference data corresponding to a difference between data output by said modulation decoding means and data output by said deinterleaving means, based on the same interleaving position information as that of said first interleaving means, for re-arraying the sequence of the difference data.

2. The data reproducing apparatus according to claim 1, wherein said modulation decoding means is fed with a soft input signal and outputs a soft output signal.

3. The data reproducing apparatus according to claim 1, wherein said recording equipment includes precode means for filtering data supplied from said first interleaving means to compensate for channel characteristics, and the data reproducing apparatus further comprising:

channel decoding means for decoding a channel response.

4. The data reproducing apparatus according to claim 3, wherein said channel decoding means is fed with a soft input signal and performs soft output decoding.

5. The data reproducing apparatus according to claim 3, wherein said channel decoding means is fed with a soft input signal and performs soft output decoding based on a trellis corresponding to the channel response.

6. The data reproducing apparatus according to claim 4, wherein said deinterleaving means interleaves data corresponding to a difference between data output by said channel decoding means and data output from said second interleaving means; and wherein said modulation decoding is iteratively performed between said modulation decoding means and said channel decoding means.

7. The data reproducing apparatus according to claim 6, wherein said recording equipment includes error correction encoding means for error correction encoding input data to supply data resulting from the error correction encoding to said modulation encoding means, and the data reproducing apparatus further comprises:

error correcting soft decoding means for soft decoding an error correction code of the soft input signal corresponding to soft output data obtained by said modulation decoding means as a result of iterative decoding.

8. The data reproducing apparatus according to claim 1, wherein said first interleaving means interleaves data encoded by said modulation encoding means.

9. The data reproducing apparatus according to claim 1, wherein said modulation decoding means effects performs decoding based on a trellis corresponding to said constraint condition.

10. The data reproducing apparatus according to claim 1, wherein said first interleaving means interleaves data encoded with block modulation by said modulation encoding means in terms of a modulation encoding block as a unit.

11. The data reproducing apparatus according to claim 1, wherein said modulation encoding means encodes input data in accordance with said trellis conforming to said constraint condition; and said modulation decoding means performs decoding based on a trellis conforming to said constraint condition.

12. The data reproducing apparatus according to claim 11, wherein said first interleaving means interleaves data encoded by said modulation encoding means in terms of a modulation encoding block of said trellis as a unit.

13. The data reproducing apparatus according to claim 2, wherein said modulation decoding means performs soft output decoding based on the BCJR algorithm or on the SOVA algorithm.

14. The data reproducing apparatus according to claim 1, data is recorded on said recording medium by a magnetic, optical or magneto-optical system.

15. A data reproducing method for reproducing data recorded by a recording method for recording data on a recording medium including a modulation encoding step of applying predetermined modulation encoding to input data having a bit sequence, encoding the input data in accordance with a constraint condition using block modulation, and a first interleaving step of interleaving data encoded in said modulation encoding step, for re-arraying a data sequence corresponding to said data encoded in said modulation encoding step, said data reproduction method comprising the steps of:

deinterleaving the input data in a sequence such as to restore the data sequence to the bit sequence;

modulation decoding data supplied from said step of deinterleaving, in conformance with said constraint condition, wherein the step of modulation decoding further includes a likelihood calculating step of calculating a likelihood value of output codewords generated and output by said modulation encoding step;

calculating posterior probability information as a soft decision value for an input bit to said modulation encoding step and an output bit from said modulation encoding step using said likelihood value as calculated by said likelihood calculating step; and interleaving difference data corresponding to a difference between data decoded in said modulation encoding step and data re-arrayed in said step of deinterleaving, based on the same interleaving position information as that of said first interleaving step, for re-arraying the sequence of the difference data.

16. The data reproducing method according to claim 15, wherein said step of modulation decoding is fed with a soft input signal and outputs a soft output signal.

17. The data reproducing method according to claim 15, wherein said recording method includes a precode step of filtering data supplied from said first interleaving step to compensate for channel characteristics, and the data reproducing method further comprising:

channel decoding a channel response.

18. The data reproducing method according to claim 17, wherein said step of channel decoding is fed with a soft input signal and performs soft output decoding.

19. The data reproducing method according to claim 17, wherein said step of channel decoding is fed with a soft input signal and performs soft output decoding based on a trellis corresponding to the channel response.

20. The data reproducing method according to claim 18, wherein said step of deinterleaving interleaves data corresponding to a difference between data decoded in said step of channel decoding and data re-arrayed in said step of interleaving;

iteratively performing decoding between said step of modulation decoding and said step of channel decoding.

21. The data reproducing method according to claim 20, wherein said recording method includes an error correction encoding step of error correction encoding input data to supply data resulting from the error correction encoding to said modulation encoding step, and the data reproducing method further comprising:

soft decoding an error correction code of the soft input signal corresponding to soft output data obtained by said modulation decoding step as a result of iterative decoding.

22. The data reproducing method according to claim 15, wherein said first interleaving step interleaves data encoded by said modulation encoding step so that the constraint condition is satisfied.

23. The data reproducing method according to claim 15, wherein said modulation decoding step effects performs decoding based on a trellis corresponding to said constraint condition.

24. The data reproducing method according to claim 15, wherein said first interleaving step interleaves data encoded with block modulation by said modulation encoding step in terms of a modulation encoding block as a unit.

25. The data reproducing method according to claim 15, wherein said modulation encoding step encodes input data in accordance with the trellis conforming to said constraint condition; and said step of modulation decoding performs decoding based on a trellis conforming to said constraint condition.

26. The data reproducing method according to claim 25, wherein said first interleaving step interleaves data encoded by said modulation encoding step in terms of a modulation encoding block of said trellis as a unit.

27. The data reproducing method according to claim 16, wherein said step of modulation decoding performs soft output decoding based on the BCJR algorithm or on the SOVA algorithm.

28. The data reproducing method according to claim 15, wherein data is recorded on said recording medium by a magnetic, optical or magneto-optical system.

29. A data recording and reproducing apparatus for recording and reproducing data for a recording medium, said apparatus comprising:

modulation encoding means for applying predetermined modulation encoding to input data having a bit sequence, wherein said modulation encoding means encodes the input data in accordance with a constraint condition by block modulation;

first interleaving means for interleaving data supplied from said modulation encoding means for re-arraying a data sequence corresponding to said data supplied from said modulation encoding means;

deinterleaving means for deinterleaving reproduced data in a sequence such as to restore the data sequence to the bit sequence;

modulation decoding means for modulation decoding data supplied from said deinterleaving means in conformance with said constraint condition, wherein said modulation decoding means further includes:

likelihood calculating means for calculating a likelihood value corresponding to output codewords output by said modulation encoding means, wherein posterior probability information as a soft decision value for an input bit to said modulation encoding means and an output bit from said modulation encoding means is calculated using said likelihood value as calculated by said likelihood calculating means; and second interleaving means for interleaving difference data corresponding to a difference between data output by said modulation decoding means and data output by said deinterleaving means, based on the same interleaving position information as that of said first interleaving means, for re-arraying the sequence of the difference data.

30. The data recording and reproducing apparatus according to claim 29, wherein said modulation decoding means is fed with a soft input signal and outputs a soft output signal.

31. The data recording and reproducing apparatus according to claim 29, further comprising:

precode means for filtering data supplied from said first interleaving means to compensate for channel characteristics, and channel decoding means for decoding a channel response.

32. The data recording and reproducing apparatus according to claim 31, wherein said channel decoding means is fed with a soft input signal and performs soft output decoding.

33. The data recording and reproducing apparatus according to claim 31, wherein said channel decoding means is fed with a soft input signal and performs soft output decoding based on a trellis corresponding to the channel response.

34. The data recording and reproducing apparatus according to claim 32, wherein said deinterleaving means interleaves data corresponding to difference between the data output by said channel decoding means and data output from said second interleaving means; and wherein said modulation decoding is iteratively performed between said modulation decoding means and said channel decoding means.

35. The data recording and reproducing apparatus according to claim 34, further comprising:

error correction encoding means for error correction encoding input data, wherein said modulation encoding means modulation encodes data supplied from said error correction encoding means; and error correcting soft decoding means for soft decoding an error correction code of the soft input signal corresponding to the soft output data obtained by said modulation decoding means as a result of iterative decoding.

36. The data recording and reproducing apparatus according to claim 29, wherein said first interleaving means interleaves data encoded by said modulation encoding means.

37. The data recording and reproducing apparatus according to claim 29, wherein said modulation decoding means performs decoding based on a trellis corresponding to said constraint condition.

38. The data recording and reproducing apparatus according to claim 29, wherein said first interleaving means interleaves data encoded with block modulation by said modulation encoding means in terms of a modulation encoding block as a unit.

39. The data recording and reproducing apparatus according to claim 29, wherein said modulation encoding means encodes input data in accordance with said trellis conforming to said constraint condition; and said modulation decoding means performs decoding based on a trellis conforming to said constraint condition.

40. The data recording and reproducing apparatus according to claim 39, wherein said first interleaving means interleaves data encoded by said modulation encoding means in terms of a modulation encoding block of said trellis as a unit.

41. The data recording and reproducing apparatus according to claim 30, wherein said modulation decoding means performs soft output decoding based on the BCJR algorithm or on the SOVA algorithm.

42. The data recording and reproducing apparatus according to claim 29, wherein data is recorded on said recording medium by a magnetic, optical or magneto-optical system.

43. A data recording and reproducing method for recording and reproducing data for a recording medium, said method comprising the steps of:

applying predetermined modulation encoding to input data having a bit sequence, wherein said modulation encoding encodes the input data in accordance with a constraint condition by block modulation;

interleaving the modulation-encoded data for re-arraying a data sequence corresponding to the modulation-encoded data;

deinterleaving reproduced data in a sequence such as to restore the data sequence to the bit sequence;

modulation decoding the data supplied from said step of deinterleaving in accordance with said constraint condition, wherein said step of modulation decoding further includes a likelihood calculating step for calculating a likelihood value corresponding to each output codeword output by said modulation encoding step;

calculating posterior probability information as a soft decision value for an input bit to said step of applying and an output bit from said step of applying using said likelihood value as calculated by said likelihood calculating step; and interleaving difference data corresponding to a difference between data decoded in said step of modulation decoding and data re-arrayed in said step of deinterleaving based on the same interleaving position information as that of said step of interleaving the modulation-encoded data.

44. The data recording and reproducing method according to claim 43, wherein said step of modulation decoding is fed with a soft input signal and outputs a soft output signal.

45. The data recording and reproducing method according to claim 43, further comprising:

filtering data supplied from said step of interleaving the modulation-encoded data to compensate for channel characteristics, and channel decoding a channel response.

46. The data recording and reproducing method according to claim 45, wherein said step of channel decoding is fed with a soft input signal and performs soft output decoding.

47. The data recording and reproducing method according to claim 45, wherein said step of channel decoding is fed with a soft input signal and performs soft output decoding based on a trellis corresponding to the channel response.

48. The data recording and reproducing method according to claim 47, wherein said step of deinterleaving interleaves data corresponding to data between data output by said step of channel decoding and data output from said step of interleaving the difference data; and iteratively performs decoding between said step of modulation decoding and said step of channel decoding.

49. The data recording and reproducing method according to claim 48, further comprising:

error correction encoding input data, wherein said step of applying modulation encodes data supplied from said step of error correction encoding; and soft decoding a error correction code of the soft input signal corresponding to soft output data obtained by said step of modulation decoding as a result of iterative decoding.

50. The data recording and reproducing method according to claim 43, wherein said step of interleaving the modulation-encoded data interleaves the modulation-encoded data so that the constraint condition is satisfied.

51. The data recording and reproducing method according to claim 43, wherein said step of modulation decoding performs decoding based on a trellis corresponding to said constraint condition.

52. The data recording and reproducing method according to claim 43, wherein said step of interleaving the modulation-encoded data interleaves the modulation-encoded data in terms of a modulation encoding block as a unit.

53. The data recording and reproducing method according to claim 43, wherein said step of applying modulation encodes input data in accordance with the trellis conforming to said constraint condition; and said step of modulation decoding performs decoding based on a trellis conforming to said constraint condition.

54. The data recording and reproducing method according to claim 53, wherein said step of interleaving the modulation-encoded data interleaves the modulation-encoded data in terms of a modulation encoding block of said trellis as a unit.

55. The data recording and reproducing method according to claim 44, wherein said modulation decoding step performs soft output decoding based on the BCJR algorithm or on the SOVA algorithm.

56. The data recording and reproducing method according to claim 43, wherein data is recorded on said recording medium by a magnetic, optical or magneto-optical system.

* * * * *

UNITED STATES PATENT AND TRADEMARK OFFICE
CERTIFICATE OF CORRECTION

PATENT NO. : 7,196,999 B2 Page 1 of 1
APPLICATION NO. : 09/814379
DATED : March 27, 2007
INVENTOR(S) : Masayuki Hattori et al.

It is certified that error appears in the above-identified patent and that said Letters Patent is hereby corrected as shown below:

In claim 9, colmn 29, line 61, "means effects performs" should read --means performs--.

In claim 23, column 31, line 22, " step effects performs" should read --step performs--.

In claim 49, column 34, line 18, " decoding a error" should read --decoding an error--.

Signed and Sealed this

Third Day of July, 2007

JON W. DUDAS
*Director of the United States Patent and Trademark Office*